United States Patent
Ohara

(10) Patent No.: US 10,411,039 B2
(45) Date of Patent: Sep. 10, 2019

(54) SEMICONDUCTOR DEVICE, DISPLAY DEVICE, AND METHOD FOR MANUFACTURING THE SAME

(71) Applicant: Japan Display Inc., Tokyo (JP)

(72) Inventor: Hiroki Ohara, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 16/016,819

(22) Filed: Jun. 25, 2018

(65) Prior Publication Data

US 2018/0308870 A1 Oct. 25, 2018

Related U.S. Application Data

(63) Continuation of application No. 15/428,537, filed on Feb. 9, 2017, now Pat. No. 10,032,799.

(30) Foreign Application Priority Data

Mar. 28, 2016 (JP) .................................. 2016-063238

(51) Int. Cl.
*H01L 27/12* (2006.01)
*G02F 1/133* (2006.01)
(Continued)

(52) U.S. Cl.
CPC ........ *H01L 27/1225* (2013.01); *G02F 1/1368* (2013.01); *G02F 1/13306* (2013.01); *H01L 27/124* (2013.01); *H01L 27/127* (2013.01); *H01L 27/1214* (2013.01); *H01L 27/1248* (2013.01); *H01L 27/1251* (2013.01); *H01L 21/02233* (2013.01)

(58) Field of Classification Search
CPC ............. H01L 27/1214; H01L 27/1251; H01L 21/02233; H01L 21/02326
USPC .................................. 349/42; 257/43; 345/76
See application file for complete search history.

(56) References Cited

U.S. PATENT DOCUMENTS

2005/0279999 A1 12/2005 Lee et al.
2009/0093093 A1 4/2009 Liu et al.
(Continued)

FOREIGN PATENT DOCUMENTS

| JP | 2005-024940 A | 1/2005 |
| JP | 2015-225104 A | 12/2015 |

(Continued)

OTHER PUBLICATIONS

Korean Office Action dated May 16, 2018 for corresponding Korean Patent Application No. 10-2017-0024090, with partial translation.

*Primary Examiner* — David Vu
*Assistant Examiner* — Brandon C Fox
(74) *Attorney, Agent, or Firm* — Michael Best & Friedrich LLP

(57) ABSTRACT

Provided is a semiconductor device including: a first transistor over a substrate, the first transistor having a gate electrode, an oxide semiconductor film, and a gate insulating film between the gate electrode and the oxide semiconductor film; an insulating film over the first transistor, the insulating film having a first film and a second film over the first film; and a terminal electrically connected to the oxide semiconductor film through an opening portion in the insulating film. The insulating film has a first region in contact with the terminal, and the first region has an oxygen composition larger than that in another region of the insulating film.

16 Claims, 18 Drawing Sheets

(51) Int. Cl.
  *G02F 1/1368* (2006.01)
  *H01L 21/02* (2006.01)

(56) References Cited

U.S. PATENT DOCUMENTS

2010/0182223 A1  7/2010  Choi et al.
2011/0084268 A1  4/2011  Yamazaki et al.

FOREIGN PATENT DOCUMENTS

| KR | 10-2012-0093864 A | 8/2012 |
|---|---|---|
| WO | 2015/031037 A1 | 3/2015 |

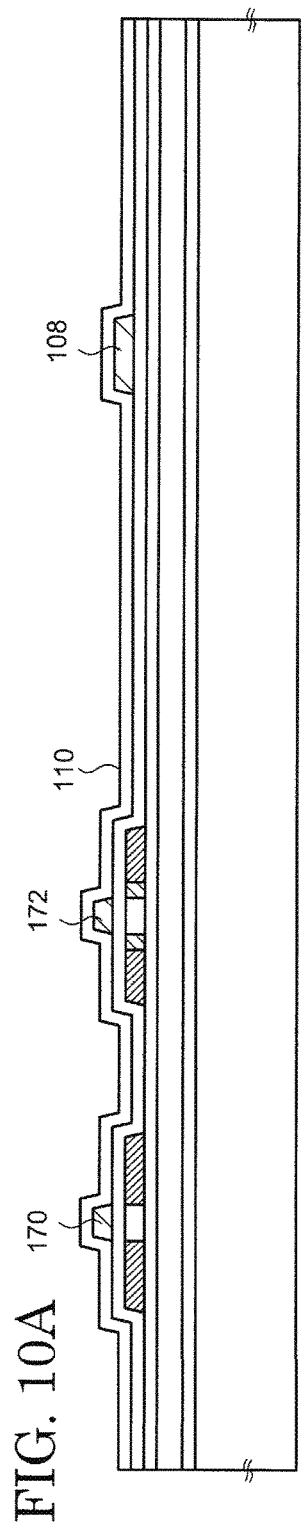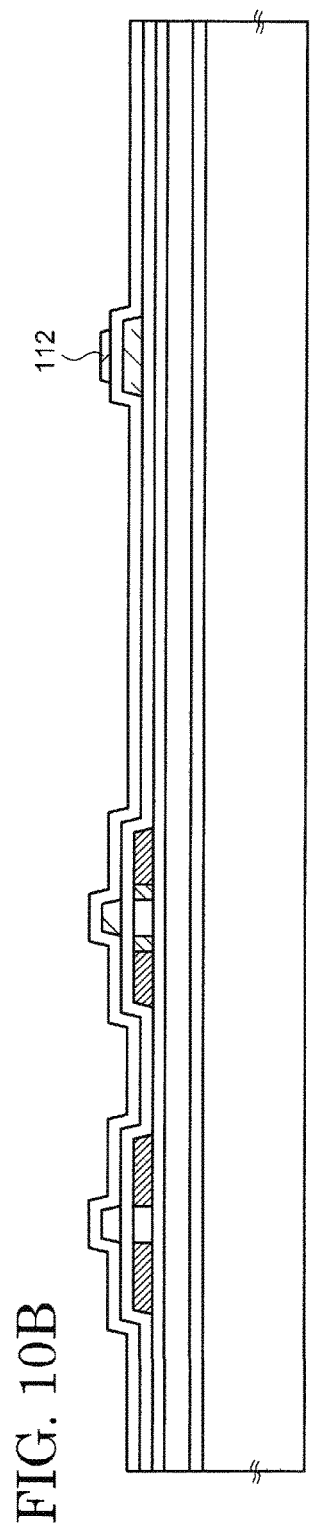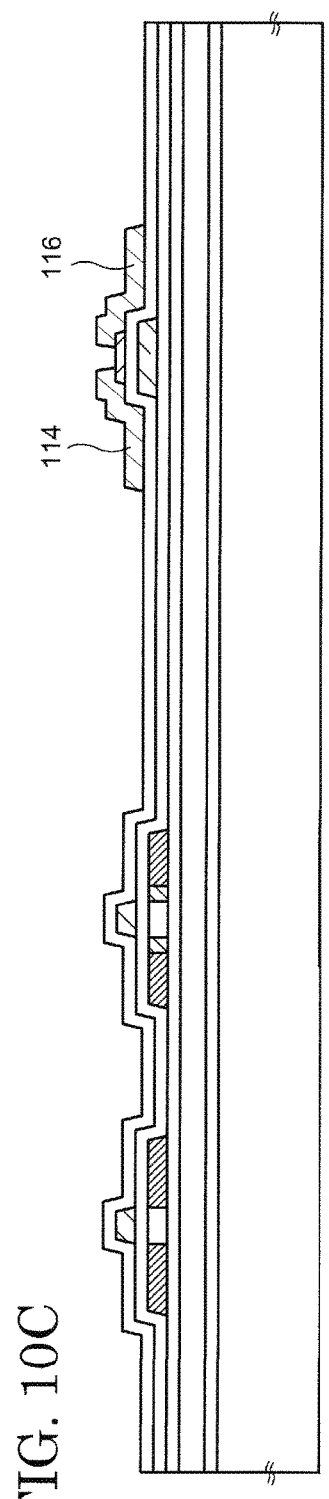

204

SEMICONDUCTOR DEVICE, DISPLAY DEVICE, AND METHOD FOR MANUFACTURING THE SAME

CROSS REFERENCE TO RELATED APPLICATIONS

This application is a continuation of U.S. application Ser. No. 15/428,537, filed on Feb. 9, 2017. Further, this application is based on and claims the benefit of priority from the prior Japanese Patent Application No. 2016-063238, filed on Mar. 28, 2016, the entire contents of which are incorporated herein by reference.

FIELD

An embodiment of the present invention relates to a semiconductor device, a display device having the semiconductor device, and a manufacturing method thereof.

BACKGROUND

As a typical example exhibiting semiconductor properties, Group 14 elements such as silicon and germanium are represented. Particularly, silicon has been utilized in almost all semiconductor devices and recognized as a material supporting the basis of the electronics industry because of its wide availability, easiness of processing, excellent semiconductor properties, and easiness of controlling properties.

Recent finding of semiconductor properties in oxides, in particular oxides of Group 13 elements such as indium and gallium, has motivated intensive research and development. As a typical example of oxides exhibiting semiconductor properties (hereinafter, referred to as an oxide semiconductor), indium-gallium oxide (IGO), indium-gallium-zinc oxide (IGZO), and the like have been known. Intensive research in recent years has realized commercialization of display devices having transistors including these oxide semiconductors as a semiconductor element. Additionally, as exemplarily disclosed in Japanese patent application publication No. 2015-225104, international publication No. 2015-031037, and United States patent application publication 2010/0182223, a semiconductor device in which both a transistor having a silicon-including semiconductor (hereinafter, referred to as a silicon semiconductor) and a transistor having an oxide semiconductor are incorporated has been developed.

SUMMARY

An embodiment of the present invention is a semiconductor device including: a first transistor over a substrate, the first transistor having a gate electrode, an oxide semiconductor film, and a gate insulating film between the gate electrode and the oxide semiconductor film; an insulating film over the first transistor, the insulating film having a first film and a second film over the first film; and a terminal electrically connected to the oxide semiconductor film through an opening portion in the insulating film. The insulating film has a first region in contact with the terminal, and the first region has an oxygen composition larger than that in another region of the insulating film.

An embodiment of the present invention is a display device including: a first transistor over a substrate, the first transistor having a gate electrode, an oxide semiconductor film, and a gate insulating film between the gate electrode and the oxide semiconductor film; an insulating film over the first transistor, the insulating film having a first film and a second film over the first film; a terminal electrically connected to the oxide semiconductor film through an opening portion in the insulating film; a leveling film over the terminal; and a display element over the leveling film. The insulating film has a first region in contact with the terminal, and the first region has an oxygen composition larger than that in another region of the insulating film.

An embodiment of the present invention is a manufacturing method of a semiconductor device. The manufacturing method includes: forming a first transistor over a substrate, the first transistor having a gate electrode, an oxide semiconductor film, and a gate insulating film between the gate electrode and the oxide semiconductor film; forming an insulating film having a first film and a second film over the first film; forming an opening portion in the insulating film; oxidizing the insulating film so that a surface portion of the opening portion has a first region with an oxygen composition larger than that in another region; and forming a terminal in the opening portion so as to be electrically connected to the oxide semiconductor film.

BRIEF DESCRIPTION OF DRAWINGS

FIG. 10A to FIG. 10O are schematic cross-sectional views showing a manufacturing method of a semiconductor device of an embodiment of the present invention;

DESCRIPTION OF EMBODIMENTS

Hereinafter, the embodiments of the present invention are explained with reference to the drawings. The invention can be implemented in a variety of different modes within its concept and should not be interpreted only within the disclosure of the embodiments exemplified below.

The drawings may be illustrated so that the width, thickness, shape, and the like are illustrated more schematically compared with those of the actual modes in order to provide a clearer explanation. However, they are only an example, and do not limit the interpretation of the invention. In the specification and the drawings, the same reference number is provided to an element that is the same as that which appears in preceding drawings, and a detailed explanation may be omitted as appropriate.

In the present invention, when a plurality of films is formed by processing one film, the plurality of films may have functions or rules different from each other. However, the plurality of films originates from a film which is formed as the same layer in the same process. Therefore, the plurality of films is defined as films existing in the same layer.

In the specification and the claims, unless specifically stated, when a state is expressed where a structure is arranged "over" another structure, such an expression includes both a case where the substrate is arranged immediately above the "other structure" so as to be in contact with the "other structure" and a case where the structure is arranged over the "other structure" with an additional structure therebetween.

First Embodiment

Figure 1A:
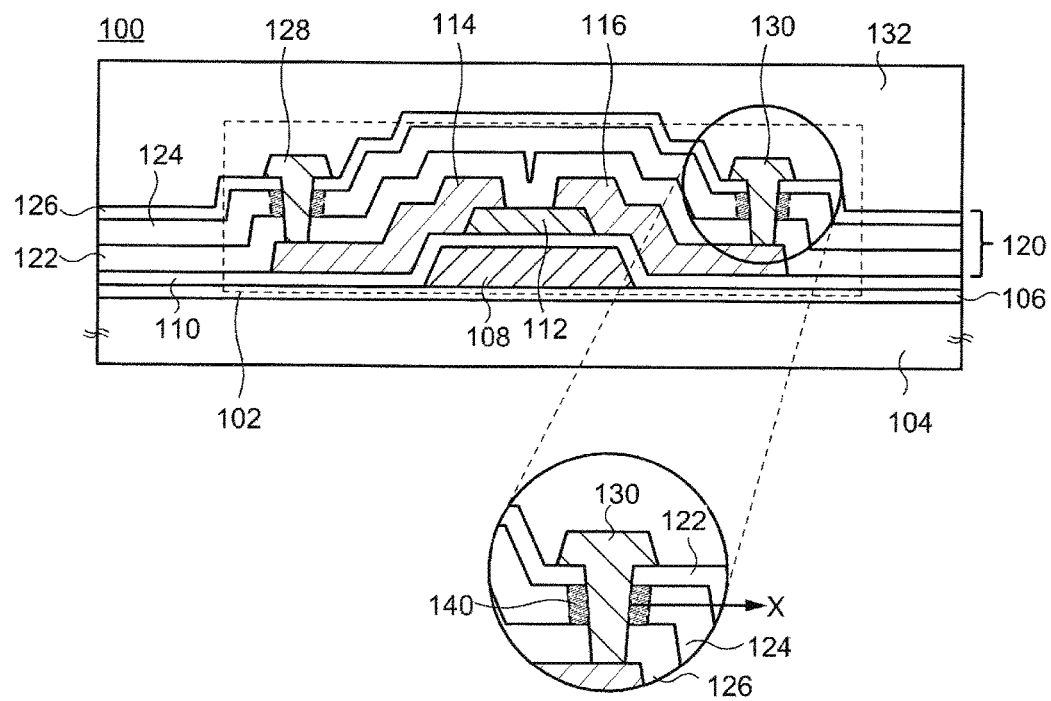
FIG. 1A and FIG. 1B are respectively a schematic cross-sectional view and an oxygen-composition profile of a semiconductor device of an embodiment of the present invention.

In the present embodiment, a semiconductor device according to an embodiment of the present invention is explained by using FIG. 1A to FIG. 4C.
1. Structure A schematic cross-sectional view of a semiconductor device 100 which is a semiconductor device according to the present embodiment is shown in FIG. 1A. The semiconductor device 100 has a first transistor 102 over a substrate 104 with an undercoat 106 interposed therebetween. The first transistor 102 includes a gate electrode 108, an oxide semiconductor film 112, and a gate insulating film 110 sandwiched by the gate electrode 108 and the oxide semiconductor film 112. The first transistor 102 further contains source/drain electrodes 114 and 116 over and electrically connected to the semiconductor film 112. In the present specification, a transistor means a structure including a gate electrode, an oxide semiconductor, a gate insulating film, and a pair of source/drain electrodes, and another element may be included in these elements.

The semiconductor device 100 further possesses an interlayer film 120 over the first transistor 102 so as to cover the semiconductor film 112 and the source/drain electrodes 114 and 116. The interlayer film 120 is an insulating film and has three films (first film 112, second film 124, and third film 126) in the present embodiment. A first terminal 128 and a second terminal 130 passing through the interlayer film 120 are provided in the semiconductor device 100 and electrically connected to the source/drain electrodes 114 and 116, respectively. The semiconductor device 100 may contain a leveling film 132 as an optional structure, and a variety of semiconductor elements exemplified by a display element may be formed over the leveling film 132.

As shown in an enlarged figure of FIG. 1A (a portion surrounded by a circle in the drawing), first regions 140 are formed in the interlayer film 120. The first regions 140 are in contact with a surface of the interlayer film 120 and spread inside from the surface of the interlayer film 120. More specifically, the first regions 140 are included in the second film 124 of the interlayer film 120, and the first terminal 128 and the second terminal 130 are in contact with the first regions 140. Therefore, the first regions 140 are formed so as to surround the first terminal 128 and the second terminal 130. An oxygen composition of the first regions 140 is larger than that of another region of the second film 124.

Figure 1B:
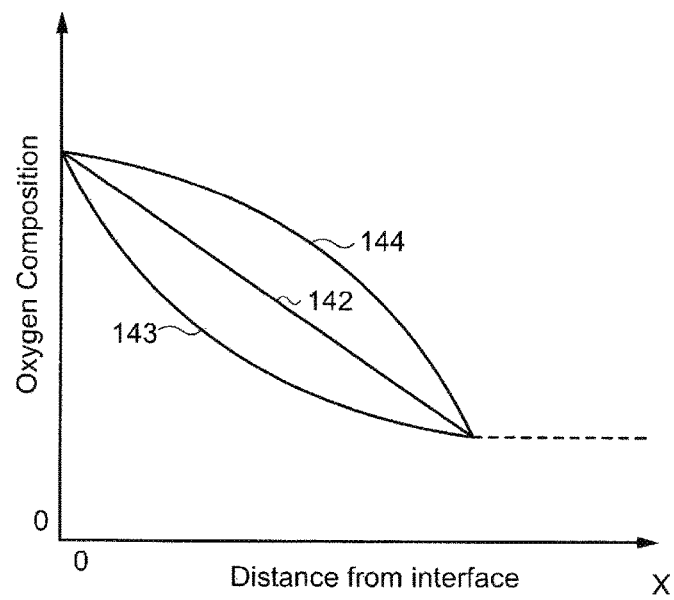

The first regions 140 can have a composition profile in which the oxygen composition decreases with increasing distance from the surface. For example, as schematically shown in FIG. 1B, the first regions 140 may be formed so that the oxygen composition decreases from an interface between the first region 140 and the first terminal 128 or an interface between the first region 140 and the second terminal 130 in a direction parallel to a top surface of the substrate 104 (a direction of an arrow X in the enlarged figure of FIG. 1A). The oxygen content may decrease linearly as illustrated by a solid straight line 142 or decrease in a curve as represented by curves 143 and 144. In the case where the oxygen content decreases in a curve, it may decrease exponentially. Note that a region of the interlayer film 120 other than the first regions 140 (i.e., another region) is a region in which the oxygen composition is substantially constant even if the distance from the surface increases and corresponds to a region expressed by a dotted straight line in FIG. 2B. The oxygen composition of the interlayer film 120 can be estimated by a secondary ion mass spectroscopy (SIMS) and the like, for example.

In FIG. 1A, the so-called bottom gate-top contact type first transistor 102 is shown as an example. However, the mode of the present embodiment is not limited thereto, and a variety of structures can be employed. For example, the first transistor 102 may be a top-gate type transistor, and any of a top-contact type and a bottom-contact type may be applied with respect to the up-and-down relationship between the source/drain electrodes 114 and 116 and the oxide semiconductor film 112. In the case of the top-gate type, the first transistor 102 may have a so-called self-align structure. In the case of the bottom-gate type, the first transistor 102 may have a so-called channel-etch type structure in which a channel region of the oxide semiconductor film 112 is thinner than the regions covered by the source/drain electrodes 114 and 116. Alternatively, the first transistor 102 may have a so-called channel-stop type structure having an insulating film between the oxide semiconductor film 112 and the source/drain electrodes 114 and 116. The first transistor 102 may not necessarily possess only a single gate electrode 108 and may be a multi-gate transistor having two or more gate electrodes.

2. Manufacturing Method

A manufacturing method of the semiconductor device 100 is explained with reference to FIG. 2A to FIG. 4C.

2-1. Substrate

Figure 2A:
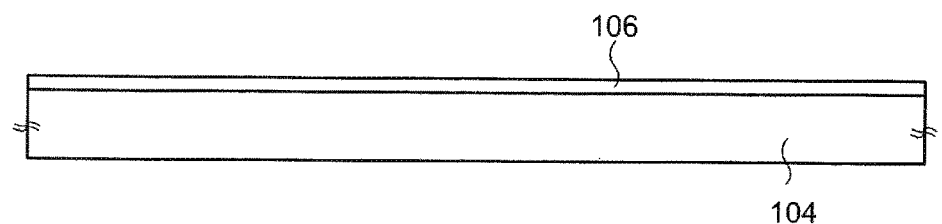
FIG. 2A to FIG. 2D are schematic cross-sectional views showing a manufacturing method of a semiconductor device of an embodiment of the present invention.

First, the undercoat 106 is formed over the substrate 104 (FIG. 2A). The substrate 104 has a function to support the first transistor 102 and a variety of semiconductor elements formed over the leveling film 132. Hence, a material having heat resistance to a process temperature of the variety of elements formed thereover and chemical stability to chemicals used in the process may be used for the substrate 104. Specifically, the substrate 104 may contain glass, quartz, plastics, a metal, ceramics, and the like. When flexibility is provided to the semiconductor device 100, a polymer material can be used. For example, a polymer material exemplified by a polyimide, a polyamide, a polyester, a polycarbonate can be employed. Note that, in the case of fabricating the semiconductor device 100 with flexibility, the substrate 104 may be called a base material or a base film.

2-2. Undercoat

The undercoat 106 is a film having a function to prevent impurities such as alkaline metal ions from diffusing from the substrate 104 to the first transistor 102 and the like and may include an inorganic insulator such as silicon nitride, silicon oxide, silicon nitride oxide, and silicon oxynitride. The undercoat 106 can be formed so as to have a single-layer or stacked-layer structure by applying a chemical vapor deposition method (CVD method), a sputtering method, a lamination method, and the like. When a CVD method is used, a tetraalkoxysilane and the like may be used as a raw-material gas. A thickness of the undercoat 106 can be freely selected from a range from 50 nm to 1000 nm, and is not necessarily constant over the substrate 104. The undercoat 106 may have different thicknesses depending on position. When the undercoat 106 is structured with a plurality of layers, a layer including silicon nitride is stacked over the substrate 104 and a layer including silicon oxide is stacked thereover.

Note that when an impurity concentration of substrate 104 is low, the undercoat 106 may not be formed or may be formed so as to partly cover the substrate 104. For example, when a polyimide with a low concentration of alkaline metal ions is used, the gate electrode 108 may be formed so as to be in contact with the substrate 104 without the formation of the undercoat 106.

2-3. Gate Electrode

Figure 2B:
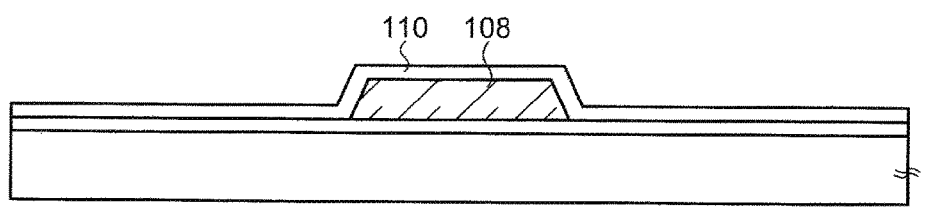

Next, the gate electrode 108 is formed over the undercoat 106 (FIG. 2B). The gate electrode 108 can be formed so as to have a single-layer or stacked layer structure by using a metal such as titanium, aluminum, copper, molybdenum, tungsten, and tantalum or an alloy thereof. When the semiconductor device 100 of the present embodiment is applied to, for example, a large-area semiconductor device such as a display device, it is preferred to use a metal with high conductivity, such as aluminum and copper, in order to prevent signal delay. For instance, a structure in which aluminum or copper is sandwiched by a metal with a relatively high melting point, such as titanium and molybdenum, can be applied.

2-4. Gate Insulating Film

Next, the gate insulating film 110 is formed over the gate electrode 108 (FIG. 2B). The gate insulating film 110 may have any of a single-layer structure and a stacked-layer structure and can include an inorganic insulator exemplified by silicon oxide, silicon nitride, silicon oxynitride, and silicon nitride oxide. It is particularly preferred to use an insulating film containing silicon oxide as the gate insulating film 110 in order to suppress carrier generation in the oxide semiconductor film 112. The gate insulating film 110 can be formed by applying a sputtering method, a CVD method, or the like. It is preferred that the atmosphere during the film-formation contain a hydrogen-containing gas such as hydrogen gas and vapor as little as possible, by which the gate insulating film 110 having a small hydrogen composition and an oxygen composition close to or larger than that of stoichiometry.

2-5. Oxide Semiconductor Film

Figure 2C:
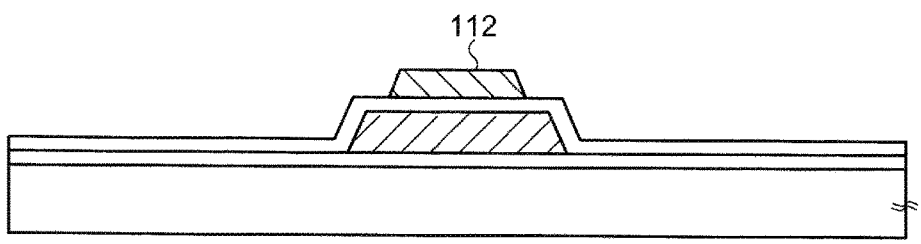

Next, the oxide semiconductor film 112 is formed over the gate insulating film 110 (FIG. 2C). The oxide semiconductor film 112 may contain Group 13 elements such as indium and gallium. The oxide semiconductor film 112 may include a plurality of different Group 13 elements and may be a mixed oxide of indium and gallium (IGO). The oxide semiconductor film 112 may further contain Group 12 elements, and a mixed oxide including indium, gallium, and zinc is represented as an example. The oxide semiconductor film 112 may contain another element such as tin of Group 14 elements, and titanium and zirconium of Group 4 elements. There is also no limitation to crystallinity of the oxide semiconductor film 112, and the oxide semiconductor film 112 may be single-crystalline, polycrystalline, microcrystalline, or amorphous. It is preferred that the oxide semiconductor film 112 possess a small number of crystal defects such as an oxygen defect.

The oxide semiconductor film 112 is formed at a thickness of 20 nm to 80 nm or 30 nm to 50 nm by utilizing a sputtering method and the like, and then processed into a desired shape by patterning (etching). When a sputtering method is applied, the film-formation may be carried out under a mixed atmosphere of argon and oxygen gas, for example. In this case, a partial pressure of argon may be lower than that of oxygen gas.

A current applied to a target may be a direct current or an alternating current and can be determined depending on a shape, a composition, and the like of the target. For example, a mixed oxide containing indium (In), gallium (Ga), and zinc (Zn) ($In_aGa_bZn_cO_d$) may be used as a target. Here, a, b, c, and d are each a real number larger than 0 and are not necessarily an integer. Hence, assuming that each element exists as the most stable ion, the aforementioned composition is not always an electrically neutral one. As an example of a target composition, $InGaZnO_4$ is represented. However, the composition is not limited thereto and may be selected as appropriate so that the oxide semiconductor film 112 or the first transistor 102 including the oxide semiconductor film 112 possesses the intended properties.

A heat treatment (annealing) may be performed on the oxide semiconductor film 112. The heat treatment may be carried out before or after patterning the semiconductor film 112. Since the oxide semiconductor film 112 may decrease in volume (shrinking) by the heat treatment, the heat treatment is preferably carried out before patterning. The heat treatment may be performed in the presence of nitrogen, dry air, or the atmosphere at an atmospheric or reduced pressure. The heating temperature can be selected from a range from 250° C. to 500° C. or from 350° C. to 450° C., and the heating time can be selected from a range from 15 minutes to 1 hour. However, the heat treatment may be carried out outside these ranges. This heat treatment allows oxygen to be introduced or migrate to the oxygen defects of the oxide semiconductor film 112, resulting in the more well-defined oxide semiconductor film 112 with a smaller number of crystal defects and higher crystallinity. As a result, the first transistor 102 having excellent electrical properties such as high reliability, a high on-current, a low off-current, and small variation in properties (threshold voltage) can be obtained.

Although not illustrated, when the first transistor 102 has a top-gate structure, for example, the semiconductor film 112 may be doped with impurities so that the oxide semiconductor film 112 possesses source/drain regions in addition to a channel region overlapping with the gate electrode 108. Crystal defects generated in the regions doped with the impurities increase conductivity and allow these regions to function as the source/drain regions.

2-6. Source/Drain Electrode

Figure 2D:
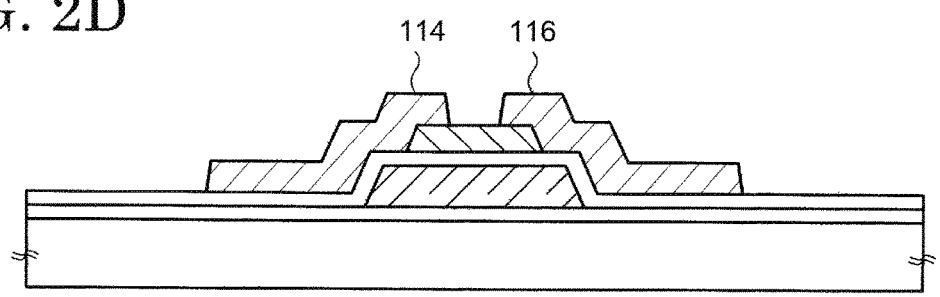

Next, the source/drain electrodes 114 and 116 are formed over the oxide semiconductor film 112 (FIG. 2D). The source/drain electrodes 114 and 116 can be formed by applying a material, a structure, and a formation method applicable to the gate electrode 108. When a channel-stop type transistor is formed for example, an insulating film including silicon oxide may be formed over the oxide semiconductor film 112, and then the source/drain electrodes 114 and 116 may be formed. Note that, a source and drain of a transistor may be interchanged depending on a polarity of a transistor and a current direction. Therefore, the source/drain electrodes 114 and 116 each may function as a source electrode and a drain electrode.

Through these processes, the first transistor 102 is formed.

2-7. Interlayer Film

Figure 3A:
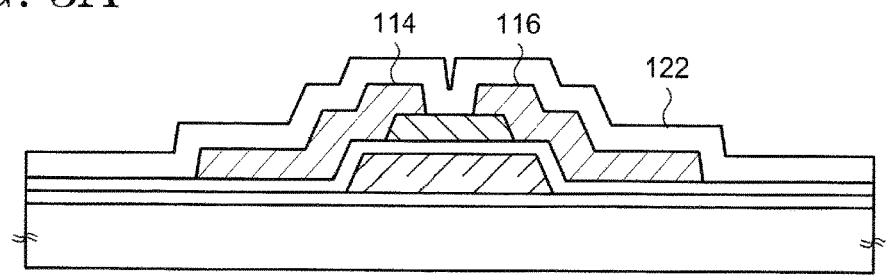
FIG. 3A to FIG. 3D are schematic cross-sectional views showing a manufacturing method of a semiconductor device of an embodiment of the present invention.

Next, the interlayer film 120 is formed over the source/drain electrodes 114 and 116. Here, the interlayer film 120 has the first film 122, the second film 124, and the third film 126, and the first film 122 is first formed (FIG. 3A).

The first film 122 may contain a material usable in the undercoat 106 and can be formed with a sputtering method or a CVD method. The first film 122 may include aluminum oxide, chromium oxide, boron nitride, and the like. The first film 122 is preferably an inorganic insulating film which does not include nitrogen, and a silicon oxide film including oxygen and silicon is given as an example. Similar to the formation of the gate insulating film 110, it is preferred that the atmosphere during the formation of the first film 122 contain a hydrogen-containing gas such as hydrogen gas and vapor as little as possible, by which the first film 122 having a small hydrogen composition and an oxygen composition close to or larger than that of stoichiometry can be formed. Accordingly, the first transistor 102 with stable and excellent electrical properties can be obtained.

Figure 3B:
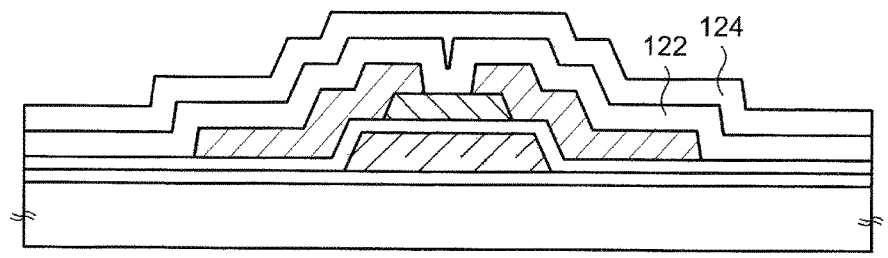

The second film 124 is formed over the first film 122 (FIG. 3B). The second film 124 also may contain a material similar to that of the first film 122 and can be formed with a method similar to that of the first film 122. The second film 124 is preferred to include a nitrogen-containing inorganic insulating material exemplified by silicon nitride containing nitrogen and silicon. The use of silicon nitride enables impurities such as hydrogen and water which may be diffused from a variety of films formed thereover (e.g., leveling film 132 etc.) to be blocked, thereby reducing influence on the electrical properties of the first transistors 102. When silicon nitride is used in the second film 124, a CVD method can be used in which ammonia or nitrogen oxide is utilized as a nitrogen source and a tetraalkoxysilane is employed as a reaction gas. In this case, the film formation is preferably carried out by reducing a flow rate of a hydrogen-containing gas so that the second film 124 has a small hydrogen composition in order to avoid influence on the electrical properties of the transistor 102. Moreover, it is preferred to perform the film formation at a relatively low temperature (equal to or higher than room temperature and equal to or lower than 300° C., preferably equal to or higher than room temperature and equal to or lower than 200° C.).

Figure 3C:
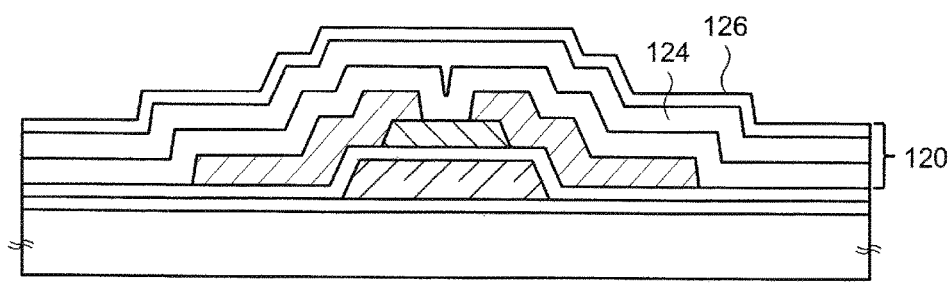

The third film 126 is formed over the second film 124 (FIG. 3C). The third film 126 also may contain a material similar to that of the first film 122 and can be formed with a method similar to that of the first film 122. The third film 126 is preferred to include an oxygen-containing inorganic insulating material exemplified by silicon oxide containing oxygen and silicon. The interlayer film 120 is formed by stacking the first film 122, the second film 124, and the third film 126.

Figure 3D:
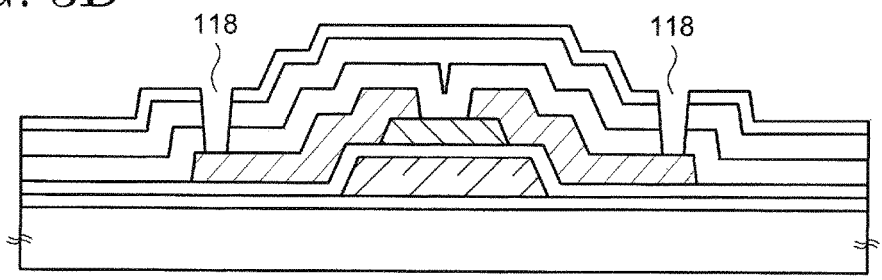

Next, opening portions (contact holes) 118 exposing the source/drain electrodes 114 and 116 are formed in the interlayer film 120 in order to form the first terminal 128 and the second terminal 130 (FIG. 3D). The opening portions can be formed, for example, by performing plasma etching in a gas including a fluorine-containing hydrocarbon.

Figure 4A:
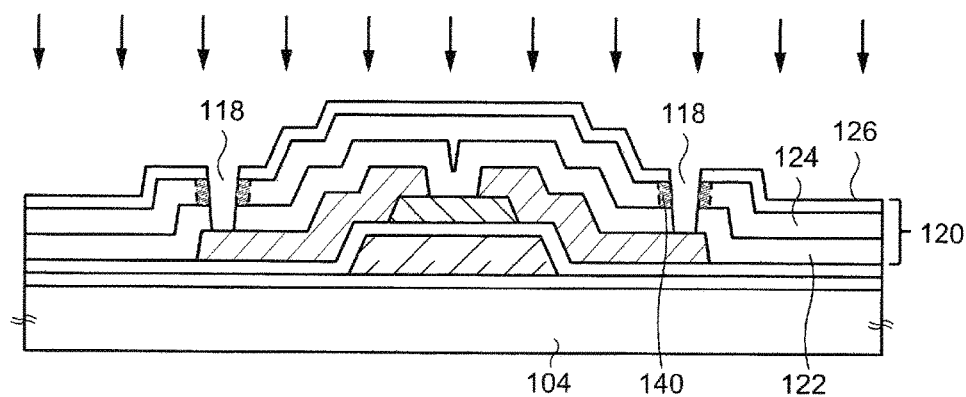
FIG. 4A to FIG. 4C are schematic cross-sectional views showing a manufacturing method of a semiconductor device of an embodiment of the present invention.

After the formation of the opening portions 118, the first regions 140 are formed by oxidizing a part of the interlayer film 120. For example, as shown in FIG. 4A, the oxidative treatment may be conducted by performing an oxygen plasma treatment on the interlayer film 120. Specifically, the substrate 104 is placed between a pair of electrodes, and a high-frequency alternating voltage is applied between the pair of electrodes under an atmosphere including an oxygen-containing gas (e.g., oxygen, ozone, etc.) to form a plasma. The frequency may be selected from 13.56 MHz, 2.45 GHz, and the like. Accordingly, oxygen-containing ions are fed to the surface of the interlayer film 120, and the interlayer film 120 is oxidized.

The oxidation proceeds from the surface of the interlayer film 120 which is collided with the oxygen-containing ions. Here, when the interlayer film 120 has a first film 122 containing silicon oxide, the second film 124 containing silicon nitride, and the third film 126 containing silicon oxide, for example, the first film 122 and the third film 126 are relatively inactive to the oxidation because they originally contain oxygen. On the other hand, the second film 124 exhibits activity to the oxidation because the second film 124 does not originally contain oxygen or contains oxygen at a relatively low composition. As a result, the oxidation proceeds in the second film 124 preferentially, resulting in the formation of the first regions 140 in the second film 124.

The oxidation allows a part of nitrogen to be replaced with oxygen or oxygen to be trapped in the crystal defects and form a bond with silicon in the second film 124. Hence, the oxygen composition in the first regions 140 formed by the oxidation is higher than that in a region other than this region 140. These first regions 140 are formed so as to surround the opening portions 118 (FIG. 4A). The first regions 140 are in contact with side surfaces of the opening portions 118 and spreads inside from the surface of the interlayer film 120 because the oxidation proceeds from the surface of the interlayer film 120. In other words, the first regions 140 form a part of the side surfaces of the opening portions 118. Therefore, the oxygen composition of the first regions 140 decreases with increasing distance from the surface of the interlayer film 120. In the case where the oxidation proceeds in the second film 124 preferentially, the oxidation proceeds in a direction parallel to a top surface of the substrate 104 (the X direction in FIG. 1A). Thus, the oxygen composition decreases with increasing distance from the interface with the opening portions 118 in this direction. The oxygen composition decreases as illustrated in FIG. 1B, for example. Hence, the interface between the first regions 140 and the region other than this region is not always clearly observed in the second film 124.

Note that the oxidation may be conducted with a wet treatment instead of the plasma treatment. Specifically, the wet treatment is carried out by contacting a solution including oxygen, ozone, or an oxidizer or vapor of oxygen-containing water with the interlayer film 120.

After the oxidative treatment is completed, an acid treatment may be carried out, by which oxide films formed over the source/drain electrodes 114 and 116 by the plasma treatment can be removed. The acid treatment can be conducted with a solution containing hydrogen fluoride, such as hydrofluoric acid, for example.

2.8 Terminal

Figure 4B:
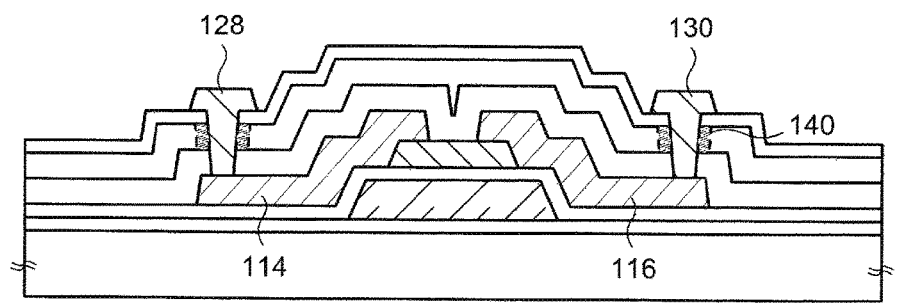

After the oxidative treatment is completed, the first terminal 128 and the second terminal 130 are formed so as to be in contact with the source/drain electrodes 114 and 116, respectively (FIG. 4B). With this process, the first terminal 128 and the second terminal 130 are electrically connected to the source/drain electrodes 114 and 116, respectively, and make contact with the first regions 140. In the formation of the first terminal 128 and the second terminal 130, a material, a structure, and a formation method applicable to the gate electrode 108 or the source/drain electrodes 114 and 116 can be employed.

2-9. Leveling Film

Figure 4C:
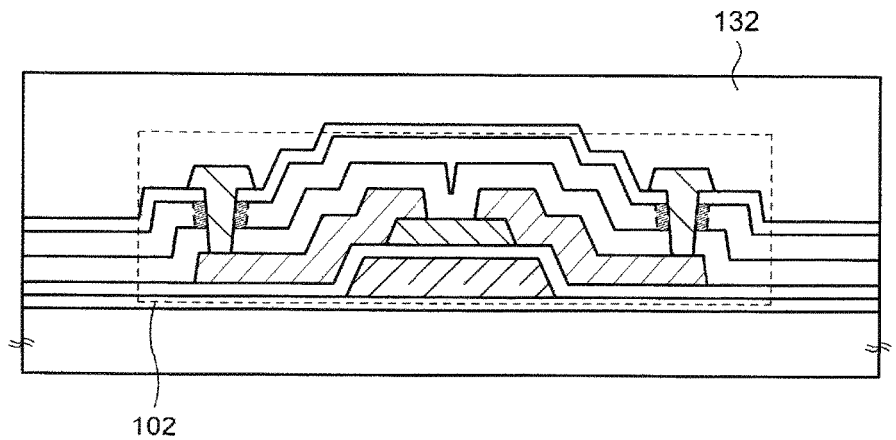

After the formation of the first terminal 128 and the second terminal 130, the leveling film 132 may be formed as an optional structure (FIG. 4C). The leveling film 132 has a function to absorb projections, depressions, and inclinations caused by the first transistor 102 and provide a flat surface. The leveling film 132 can be formed with an organic insulator. As an organic insulator, a polymer material such as an epoxy resin, an acrylic resin, a polyimide, a polyamide, a polyester, a polycarbonate, and a polysiloxane, and the leveling film 132 can be formed with a wet-type film-formation method such as a spin-coating method, an ink-jet method, a printing method, and a dip-coating method. The leveling film 132 may have a stacked structure including a layer containing the aforementioned organic insulator and a layer containing an inorganic insulator. In this case, a silicon-containing inorganic insulator such as silicon oxide, silicon nitride, silicon nitride oxide, and silicon oxynitride is represented as an inorganic insulator, and the layer containing an inorganic insulator can be formed with a sputtering method or a CVD method. Through the aforementioned processes, the semiconductor device 100 can be manufactured.

As described above, a function of the interlayer film 120 is to prevent impurities diffused from a variety of films (e.g., leveling film 132) formed over the first transistor 102 from entering the first transistor 102. Therefore, it is preferred that the interlayer film 120 contain silicon nitride with low permeability to water and oxygen. On the other hand, in the case where a film containing silicon nitride is formed, it is preferred to form the film at a reduced flow rate of the nitrogen-source gas including hydrogen at a relatively low temperature. However, when a film containing silicon nitride is formed under such conditions, chemical stability is reduced and a part or all of the film may disappear when treated with an acid such as hydrofluoric acid, which remarkably reduces the ability to block impurities. For example, when an acid treatment is conducted after the formation of the opening portions 108, a part of the second film 124 may be lost by etching (side etching) with hydrofluoric acid.

However, as described above, when the semiconductor device 100 described in the present embodiment is fabricated, the oxidative treatment is performed on the interlayer film 120, by which the oxidation proceeds from the surface of the film containing silicon nitride (e.g., second film 124) to form the first regions 140. With this process, the region with an increased oxygen composition is formed at the surface of the film containing silicon nitride, and the chemical stability is improved, by which side etching can be prevented even if an acid treatment is carried out. As a result, the loss of the interlayer film 120 and deterioration of its function can be avoided, allowing the production of the semiconductor device 100 with excellent electrical properties.

Second Embodiment

In the present embodiment, a semiconductor device according to an embodiment of the present invention and a manufacturing method thereof are explained by using FIG. 5A to 7B. Explanation of duplicated content of the First Embodiment may be omitted.

1. Structure

Figure 5A:
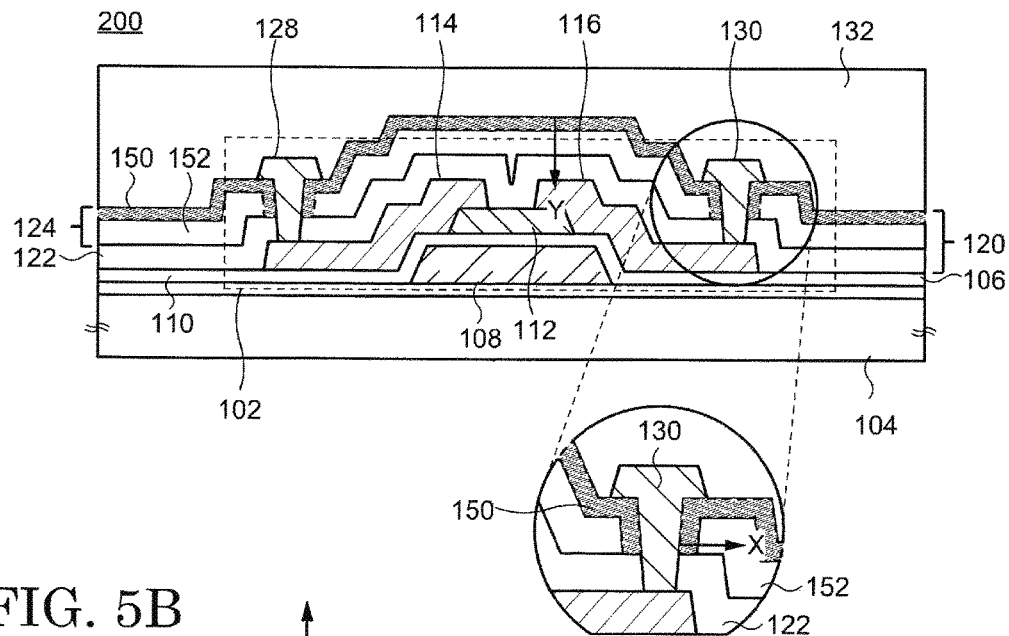
FIG. 5A is a schematic cross-sectional view and an oxygen-composition profile of a semiconductor device of an embodiment of the present invention.

A cross-sectional view of a semiconductor device 200 of the present embodiment is shown in FIG. 5A. A difference from the semiconductor device 100 is the structure of the interlayer film 120. The interlayer film 120 of the semiconductor device 200 has the first film 122 and the second film 124, and the second film 124 has first regions 150 at its top surface and in a region in contact with the first terminal 128 or the second terminal 130 and a region other than this region (second region) 152. The First Embodiment can be adopted with respect to the structures other than this difference.

More specifically, the first film 122 corresponds to the first film 122 of the First Embodiment and is a silicon-containing inorganic insulating film including silicon oxide, silicon nitride, silicon oxynitride, and silicon nitride oxide. The first film 122 is preferably a film which contains silicon oxide but does not contain nitrogen, and its small hydrogen composition and an oxygen composition close to or larger than that of stoichiometry allows the formation of the first transistor 102 with stable and excellent electrical properties.

The second film 124 is also an inorganic insulating film containing an inorganic insulator including silicon, such as silicon oxide, silicon nitride, silicon oxynitride, and silicon nitride oxide. The second film 124 is preferably a film containing an inorganic insulator including nitrogen and silicon, such as silicon nitride having high blocking ability of impurities. The second film 124 has a function to prevent impurities from entering the first transistor 102.

The first regions 150 of the second film 124 spread from the top surface of the second film 124 and from an interface with the first terminal 128 or the second terminal 130 and has a higher oxygen composition compared with that of the second region 152.

Figure 5B:
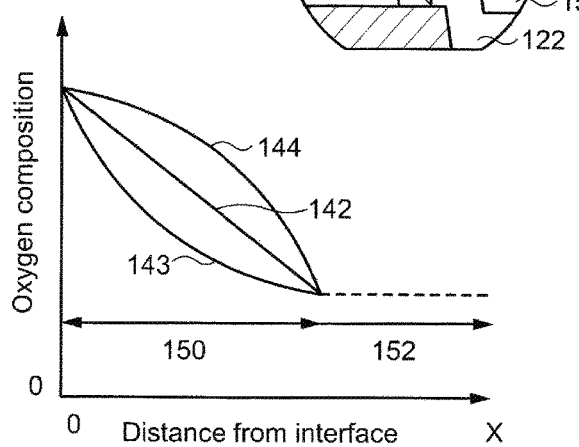
FIGS. 5B and 5C are oxygen-composition profiles of a semiconductor device of an embodiment of the present invention.
Figure 5C:
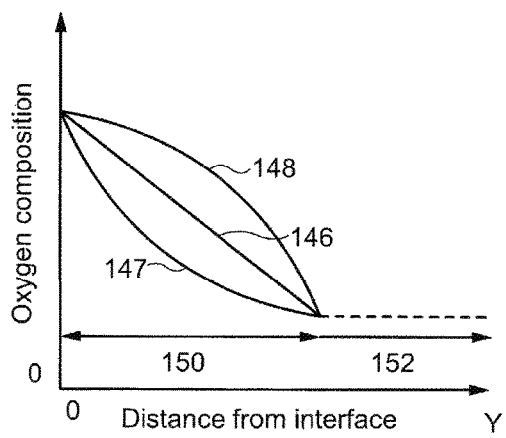

Similar to the first regions 140 of the semiconductor device 100 of the First Embodiment, the first regions 150 may have a composition profile in which the oxygen composition decreases with increasing distance from the surface. For example, as schematically shown in FIG. 5B, the first regions 150 may be formed so that the oxygen composition decreases with increasing distance from the interface between the first region 150 and the first terminal 128 or the interface between the first region 150 and the second terminal 130 in a direction (a direction of an arrow X in FIG. 5A) parallel to the top surface of the substrate 104. Similarly, as shown in FIG. 5C, the first regions 150 may be formed so that the oxygen composition decreases with increasing distance from a top surface of the first regions 150 in a direction (a direction of an arrow Y in FIG. 5A) perpendicular to the top surface of the substrate 104. The oxygen composition may decrease linearly as illustrated by solid straight lines 142 and 146 or in a curve as represented by curves 143, 144, 147, and 148. When the oxygen composition decreases in a curve, it may decrease exponentially. The second region 152 is a region in which the oxygen composition is substantially constant even if the distance from the surface increases and corresponds to a region expressed by dotted lines in FIG. 5B and FIG. 5C.

2. Manufacturing Method

Figure 6A:
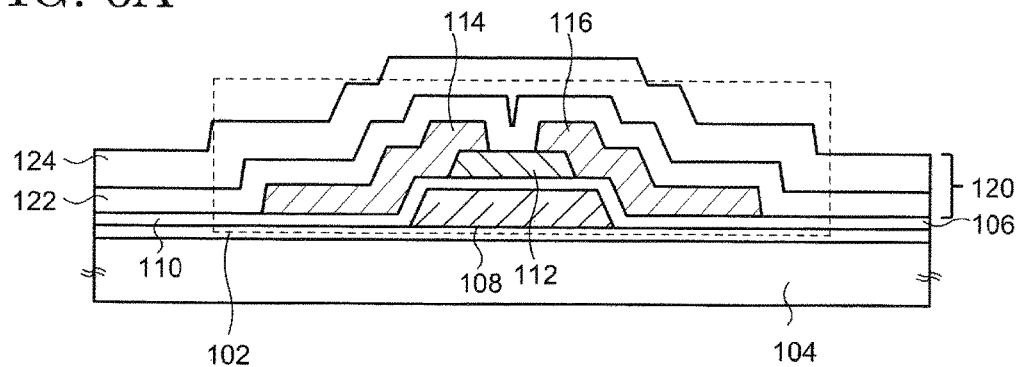
FIG. 6A to FIG. 6C are schematic cross-sectional views showing a manufacturing method of a semiconductor device of an embodiment of the present invention.

A manufacturing method of the semiconductor device 200 is explained with reference to FIG. 6A to FIG. 7B. Similar to the First Embodiment, the first transistor 102 is formed over the substrate 104 with the undercoat 106 interposed therebetween, and then the interlayer film 120 is formed (FIG. 6A). The interlayer film 120 possesses the first film 122 and the second film 124 which correspond to the first film 122 and the second film 124 of the First Embodiment, respectively. It is preferred that the first film 122 have silicon oxide including silicon and oxygen and the second film 124 have silicon nitride including silicon and nitrogen.

Figure 6B:
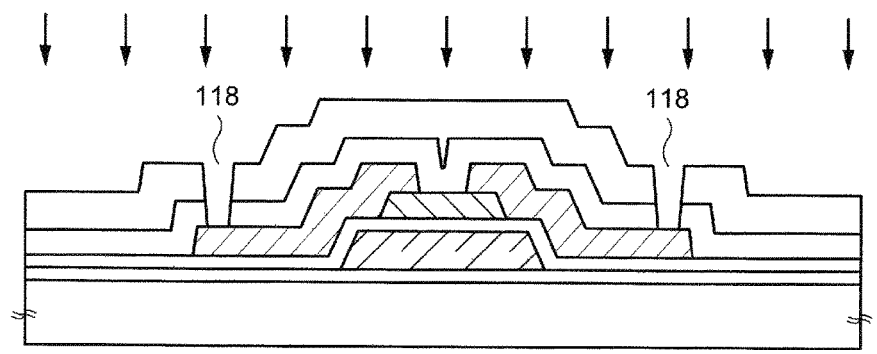

After the formation of the second film 124, the opening portions 118 exposing the source/drain electrodes 114 and 116 are formed in the interlayer film 120 in order to form the first terminal 128 and the second terminal 130 (FIG. 6B). As the formation method of the opening portions 118, the method described in the First Embodiment can be used.

After forming the opening portions 118, the oxidative treatment is performed to oxidize a part of the interlayer film 120. The oxidative treatment can be conducted similarly to that described in the First Embodiment.

The oxidation proceeds from the surface of the interlayer film 120 which is collided with oxygen-containing ions. Therefore, in the case where the interlayer film 120 has the first film 122 including silicon oxide and the second film 124 including silicon nitride, for example, the first film 122 is relatively inactive to the oxidation because the first film 122 originally contains oxygen. On the other hand, the second film 124 exhibits activity to the oxidation because the second film 124 does not originally contain oxygen or contains oxygen at a low composition. As a result, the oxidation proceeds preferentially in the second film 124.

Figure 6C:
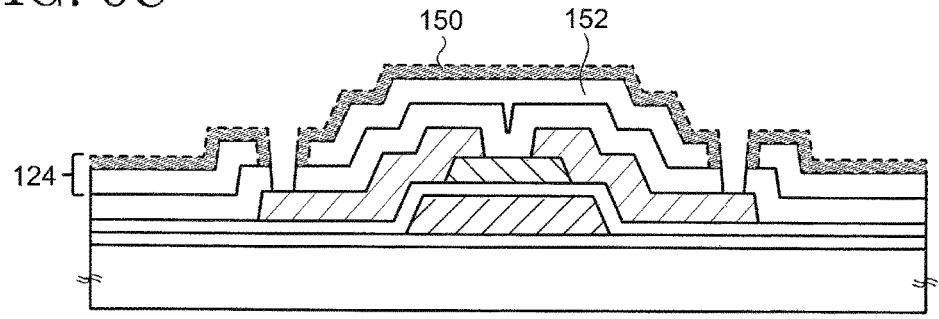

The oxidation allows a part of nitrogen to be replaced or oxygen to be trapped in the crystal defects and form a bond with silicon in the second film 124. Hence, the oxygen composition in the first regions 150 formed by the oxidation is higher than that in the second region 152. The oxidation proceeds from the surface of the interlayer film 120. Therefore, the first regions 150 are formed not only at the top surface of the second film 124 and the vicinity thereof but also in a portion in contact with the side surfaces of the opening portions 118. Accordingly, the first regions 150 are in contact with the opening portions 118, surround the opening portions 118, spread from the surface of the interlayer film 120, and form a part of the side surfaces of the opening portions 118 (FIG. 6C).

Figure 7A:
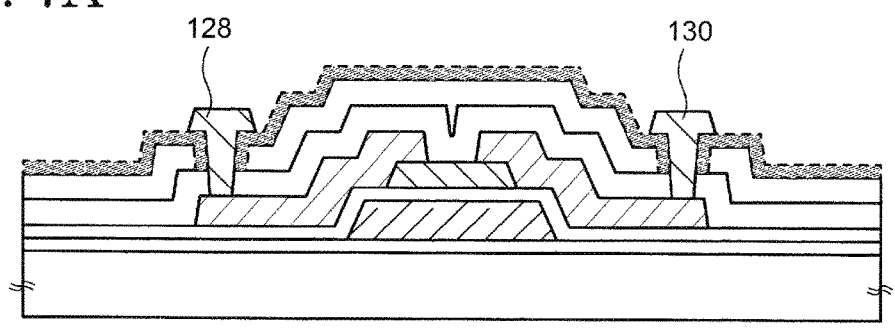
FIG. 7A and FIG. 7B are schematic cross-sectional views showing a manufacturing method of a semiconductor device of an embodiment of the present invention.
Figure 7B:
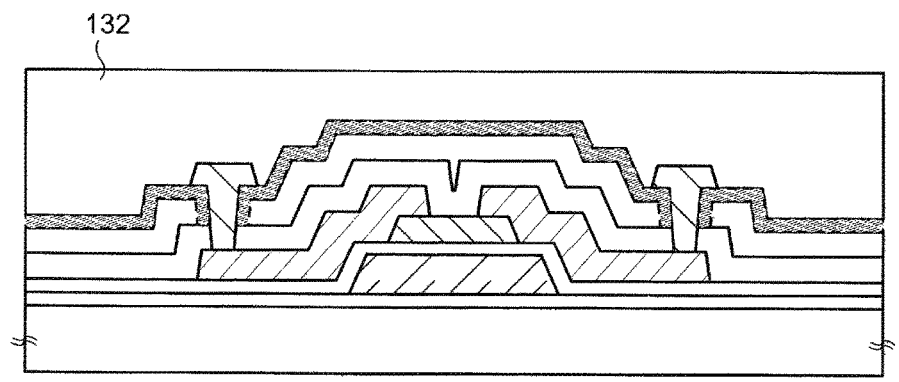

After that, similar to the First Embodiment, the first terminal 128 and the second terminal 130 are formed in the opening portions 118 (FIG. 7A). Furthermore, the leveling film 132 may be formed as an optional structure (FIG. 7B). Through the processes up to this stage, the semiconductor device 200 is obtained.

In the manufacturing method of the semiconductor device 200 described in the present embodiment, a part of the film (second film 124) which has high ability to block impurities but possesses low chemical stability is oxidized by performing the oxidative treatment. As a result, the film (first regions 150) having high chemical stability can be provided while leaving the film (second region 152) having high ability to block impurities. Hence, it is possible to provide the interlayer film 120 which is stable to an acid treatment such as a treatment with hydrofluoric acid and able to effectively block impurities, by which a semiconductor device with small variation in properties and excellent electrical properties can be supplied.

Third Embodiment

In the present embodiment, a semiconductor device according to an embodiment of the present invention and a manufacturing method thereof are explained by using FIGS. 8 to 12B. Explanation of duplicated contents of the First Embodiment may be omitted.

1. Structure

Figure 8:
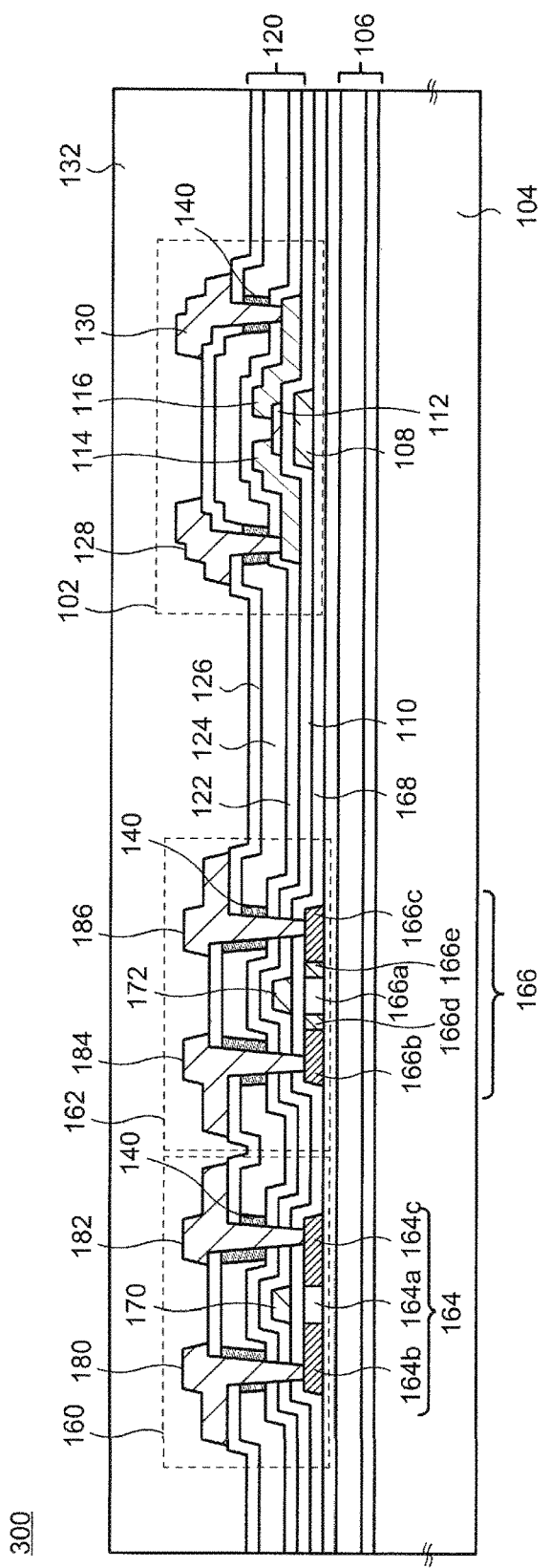
FIG. 8 is a schematic cross-sectional view of a semiconductor device of an embodiment of the present invention.

A cross-sectional view of a semiconductor device 300 of the present embodiment is shown in FIG. 8. The semiconductor device 300 possesses a second transistor 160 and a third transistor 162 in addition to the first transistor 102 described in the First Embodiment. Although not shown, it is possible to dispose the first transistor 102 described in the Second Embodiment instead of the first transistor 102 described in the First Embodiment.

More specifically, the semiconductor device 300 has the undercoat 106 over the substrate 104 and possesses the second transistor 160 and the third transistor 162 so as to be in contact with the undercoat 106.

The second transistor 160 and the third transistor 162 have semiconductor films containing silicon (hereinafter, referred to as silicon semiconductor film) 164 and 166, respectively, over which a second gate electrode 170 and a third gate electrode 172 are respectively provided with a second gate insulating film 168 sandwiched therebetween. The second transistor 160 and the third transistor 162 shown here each have a top-gate type self-align structure. However, similar to the first transistor 102 of the First Embodiment, the second transistor 160 and the third transistor 162 may possess a variety of structures.

The silicon semiconductor films 164 and 166 can include crystalline silicon, polycrystalline silicon, microcrystalline silicon, or amorphous silicon. Hereinafter, an embodiment is described as an example in which the silicon semiconductor films 164 and 166 include polycrystalline silicon. As shown in FIG. 8, the silicon semiconductor films 164 and 166 each have a channel region and source/drain regions. In the example shown in FIG. 8, the silicon semiconductor film 164 has a channel region 164$a$ and source/drain regions 164$b$ and 164$c$, while the silicon semiconductor film 166 has a channel region 166$a$, source/drain regions 166$b$ and 166$c$, and low-concentration impurity regions (LDD) 166$d$ and 166$e$. Compared with the channel regions 164$a$ and 166$a$, the source/drain regions 164$b$, 164$c$, 166$b$, and 166$c$ have a higher impurity concentration, and therefore, conductivity thereof is high. As the impurities, an element imparting p-type conductivity, such as boron and aluminum, and an element imparting n-type conductivity, such as phosphor and nitrogen, are represented. In the example shown in FIG. 8, the silicon semiconductor film 164 is doped with an element imparting p-type conductivity, while the silicon semiconductor film 166 is doped with an element imparting n-type conductivity.

The first transistor 102 has a structure which is the same as that of the first transistor 102 described in the First Embodiment, and the gate electrode 108 thereof is located over the second gate insulating film 168. Therefore, the second gate electrode 170 and the third gate electrode 172 exist in the same layer as the gate electrode 108.

The gate insulating film 110 of the first transistor 102 extends so as to cover the second gate electrode 170 and the third gate electrode 172. Similarly, the interlayer film 120 extends so as to cover the second gate electrode 170 and the third gate electrode 172. The gate insulating film 110 and the interlayer film 120 also function as a film to protect the second transistor 160 and the third transistor 162.

The second transistor 160 further possesses source/drain electrodes 180 and 182, and the third transistor 162 further has source/drain electrodes 184 and 186. As described below, these electrodes can be formed simultaneously with the first terminal 128 and the second terminal 130 of the first transistor 102, and therefore can exist in the same layer. Although not shown, one of the source/drain electrodes 180 and 182 may be electrically connected to one of the source/drain electrodes 184 and 186 to form a complementary metal oxide semiconductor (CMOS) transistor from the second transistor 160 and the third transistor 162.

Similar to the First Embodiment, the interlayer film 120 has the first regions 140. The first regions 140 are also included in the second transistor 160 and the third transistor 162 and provided so as to surround the source/drain electrodes 180, 182, 184, and 186 as shown in FIG. 8. The first regions 140 have a higher oxygen composition than another region of the second film 124.

Similar to the First Embodiment, the semiconductor device 300 may have the leveling film 132 as an optional structure.

2. Manufacturing Method

A manufacturing method of the semiconductor device 300 is explained with reference to FIG. 9A to FIG. 12B. Descriptions which are the same as those of the First Embodiment may be omitted.

2-1. Undercoat

Figure 9A:
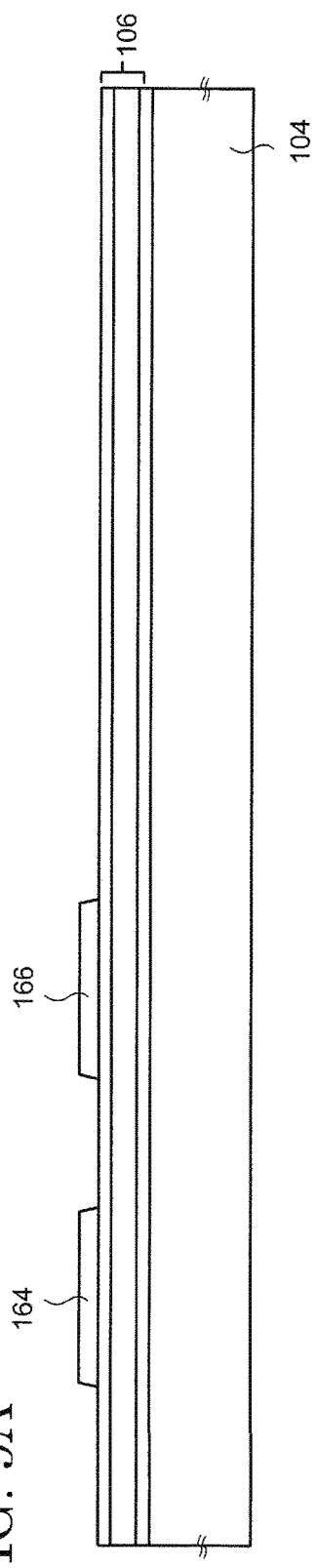
FIG. 9A to FIG. 9C are schematic cross-sectional views showing a manufacturing method of a semiconductor device of an embodiment of the present invention.

The undercoat 106 is formed over the substrate 104 (FIG. 9A). The undercoat 106 can be formed with the method described in the First Embodiment. In the present embodiment, the undercoat 106 has a structure in which three layers are stacked as shown in FIG. 8 and FIG. 9A and may contain the material described in the First Embodiment as appropriate. For example, the undercoat 106 may have a structure in which a film containing silicon oxide, a film containing silicon nitride, and a film containing silicon oxide are stacked in this order from a side of the substrate 104.

2-2. Silicon Semiconductor Film

Next, the silicon semiconductor films 164 and 166 are formed over the undercoat 106. There is no limitation to crystallinity of the silicon semiconductor films 164 and 166. When a polycrystalline morphology is employed, for example, amorphous silicon (a-Si) with a thickness of approximately 50 nm to 100 nm is formed with a CVD method, and a heat treatment or irradiation of light such as a laser is conducted to crystalize a-Si. The crystallization may be carried out in the presence of a catalyst such as nickel.

2-3. Second Gate Insulating Film

Figure 9B:
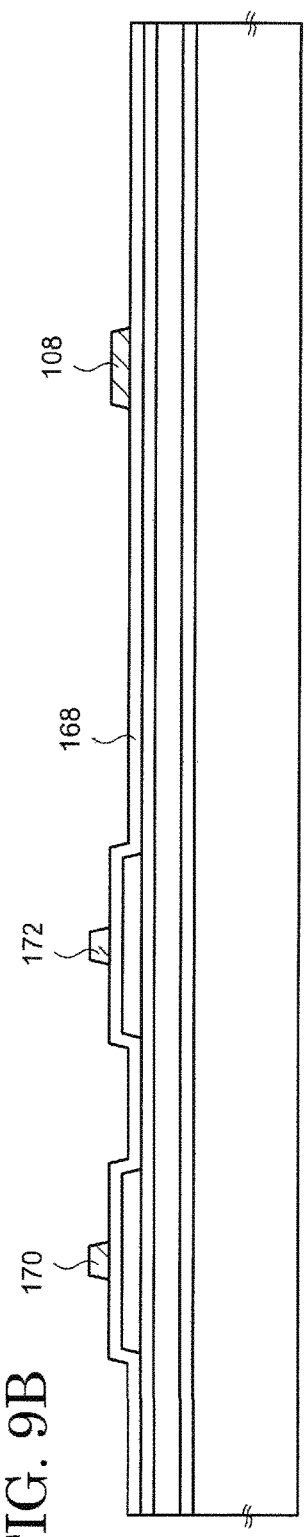

Next, the second gate insulating film 168 is formed so as to cover the silicon semiconductor films 164 and 166 (FIG. 9B). The second gate insulating film 168 can be formed by applying the material and the method similar to those of the gate insulating film 110. For example, the second gate insulating film 168 can be formed with a CVD method by using an alkoxysilane such as tetraethoxysilane as a raw material.

2-4. Gate Electrode, Second Gate Electrode, and Third Gate Electrode

Next, the gate electrode 108 is formed over the second gate insulating film 168. Simultaneously, the second gate electrode 170 and the third gate electrode 172 are formed so as to overlap with the silicon semiconductor films 164 and 166 (FIG. 9B). Therefore, these gate electrodes exist in the same layer. These gate electrodes can be formed by using the material and the formation method applicable to the gate electrode 108 described in the First Embodiment.

After that, an ion-implantation treatment or an ion-doping treatment is performed on the silicon semiconductor films 164 and 166 from over the substrate 104 by using the second gate electrode 170 and the third gate electrode 172 as a mask. In the semiconductor device 300 of the present embodiment, the silicon semiconductor film 164 is doped with ions imparting p-type conductivity, by which the source/drain regions 164$b$ and 164$c$ are formed in the regions of the silicon semiconductor film 164 which do not overlap with the second gate electrode 170, and the channel region 164$a$ which is not substantially doped with ions is simultaneously formed (FIG. 9C) On the other hand, the silicon semiconductor film 166 is doped with ions imparting n-type conductivity, by which the source/drain regions 166$b$ and 166$c$ are formed in the regions of the silicon semiconductor film 166 which do not overlap with the third gate electrode 172, and the channel region 166$a$ which is not substantially doped with ions is simultaneously formed (FIG. 9C)

Figure 9C:
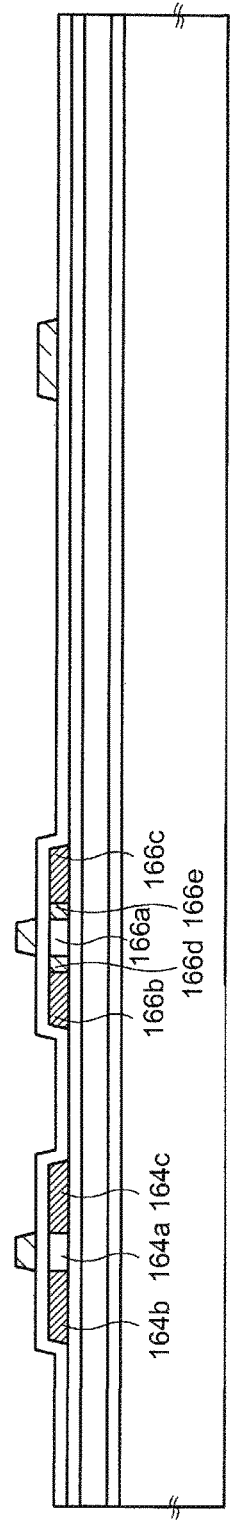

As shown in FIG. 9C, when the LDD 166$d$ and 166$e$ are arranged between the source/drain regions 166$b$ and the channel region 166$a$ and between the source/drain regions 166$c$ and the channel region 166$a$ of the silicon semiconductor film 166, the LDD 166$d$ and 166$e$ can be formed by forming an insulating film on a side surface of the third gate electrode 172 and performing ion doping therethrough, for example. The doped ions may be activated by conducting a heat treatment after the ion-doping.

2-5. Gate Insulating Film

Next, the gate insulating film 110 of the first transistor 102 is formed over the gate electrode 108 (FIG. 10A). At this time, the gate insulating film 110 is formed so as to cover not only the gate electrode 108 but also the second gate electrode 170 and the third gate electrode 172. The material and the formation method described in the First Embodiment can be adopted to those of the gate insulating film 110. For example, a single-layer film of silicon oxide or a film containing a film including silicon nitride and a film including silicon oxide are stacked from the side of the substrate 104.

2-6. Oxide Semiconductor Film

Next, the oxide semiconductor film 112 is formed over the gate insulating film 110 so as to overlap with the gate electrode 108 (FIG. 10B). The formation method is the same as that described in the First Embodiment.

Next, the source/drain electrodes 114 and 116 are formed over the oxide semiconductor film 112 by applying the material, structure, and method described in the First Embodiment (FIG. 10O).

2-8. Interlayer Film

Figure 11A:
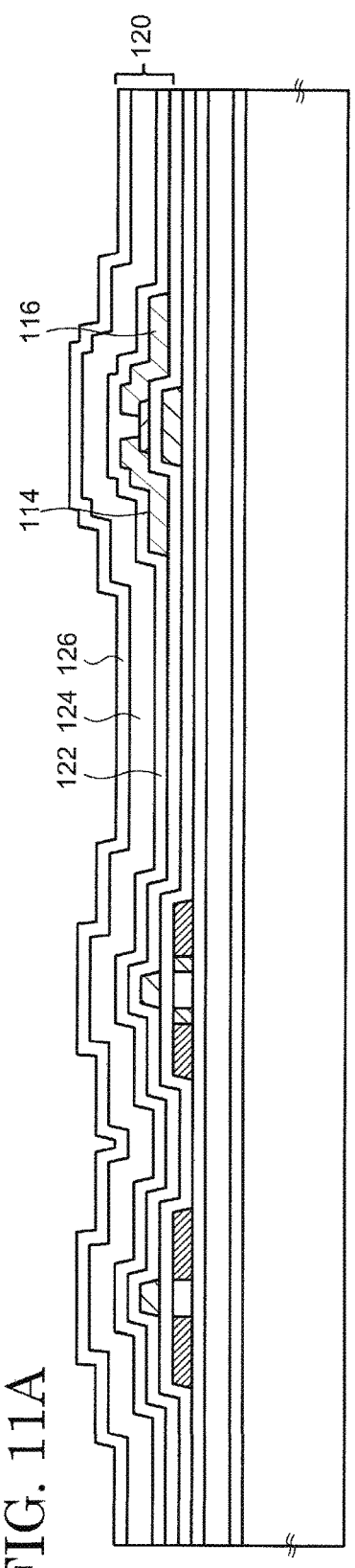
FIG. 11A and FIG. 11B are schematic cross-sectional views showing a manufacturing method of a semiconductor device of an embodiment of the present invention.

Next, the interlayer film 120 is formed over the source/drain electrodes 114 and 116 by applying the material, structure, and method described in the First Embodiment (FIG. 11A). The interlayer film 120 is formed so as to cover the first transistor 102, the second transistor 160, and the third transistor 162. Similar to the First Embodiment, the interlayer film 120 possesses the first film 122, the second film 124, and the third film 126, and it is preferred that the first film 122 and the third film 126 include silicon oxide, and the second film 124 include silicon nitride. In this case, silicon oxide preferably has a small hydrogen composition and an oxygen composition close to or larger than that of stoichiometry.

Figure 11B:
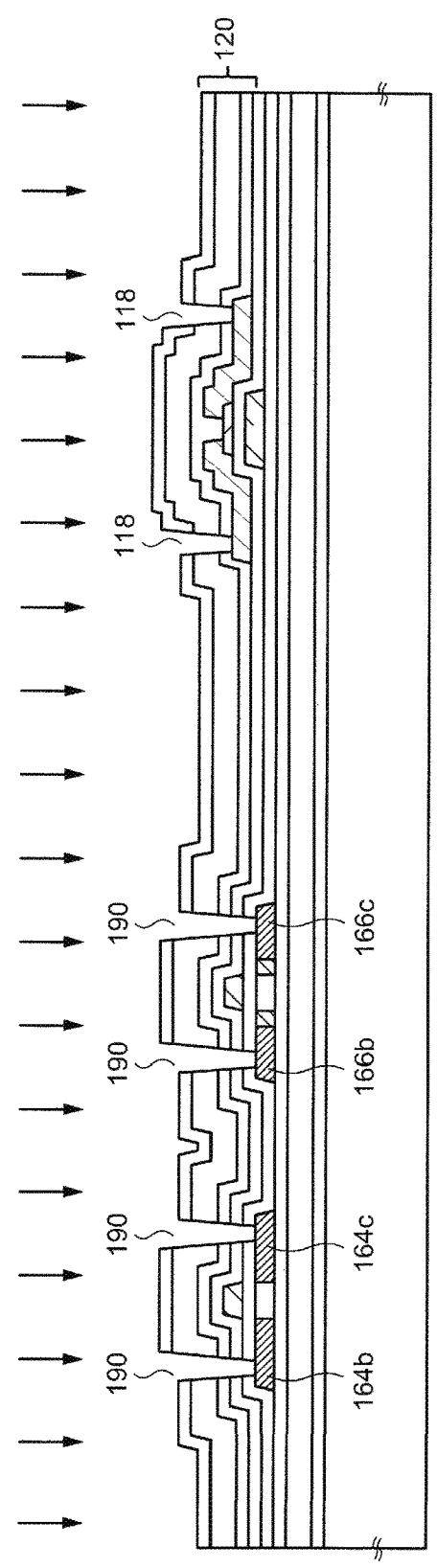

Next, the opening portions 118 exposing the source/drain electrode 114 and 116 and opening portions 190 (second opening portions) exposing the source/drain regions 164b, 164c, 166b, and 166c are formed in the interlayer film 120 and the gate insulating film 110 (FIG. 11B). The opening portions 118 and 190 can be formed by conducting plasma etching in a gas including a fluorine-containing hydrocarbon, for example. The opening portions 118 and the opening portions 190 can be formed individually. However, simultaneous formation allows a reduction in the number of processes.

Figure 12A:
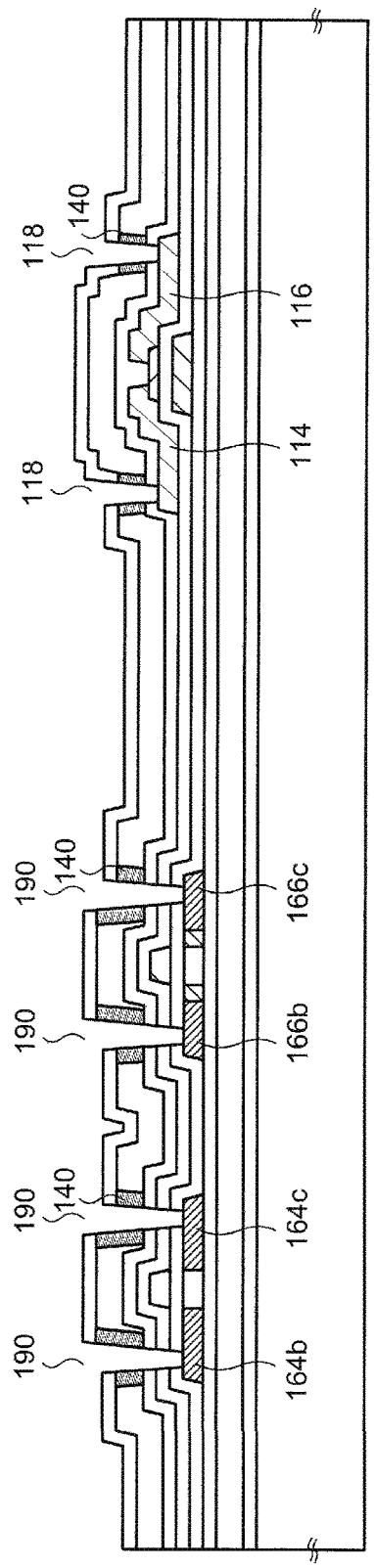
FIG. 12A and FIG. 12B are schematic cross-sectional views showing a manufacturing method of a semiconductor device of an embodiment of the present invention.

After forming the opening portions 118 and 190, the oxidative treatment is performed in order to oxidize a part of the insulating film 120 (FIG. 11B). The oxidative treatment may be carried out by applying the method described in the First Embodiment. With this process, the first regions 140 are formed in the second film 124 (FIG. 12A). The oxygen composition of these first regions 140 is higher than that of another region of the second film 124. In this case, the first regions 140 are exposed not only in the opening portions 118 but also in the opening portions 190. In other words, the first regions 140 having a higher oxygen composition structure form the side surfaces of the opening portions 118 and 190 and are formed so as to surround the opening portions 118 and 190.

The oxidative treatment oxidizes the surfaces of the source/drain regions 164b, 164c, 166b, and 166c, resulting in thin oxide films. The oxide films are also formed on the source/drain electrodes 114 and 116 depending on the material used. If the thin oxide films are not removed, large contact resistance is caused between the first terminal 128 and the second terminal 130 formed later and the source/drain electrodes 180, 182, 184, and 186. Thus, an acid treatment is performed on the surfaces of the semiconductor films 164 and 166 in order to remove the oxide films.

As described in the First Embodiment, a preferred embodiment is to form the second film 124 containing silicon nitride at a relatively low temperature under the conditions giving a small hydrogen composition thereof. Such a film is relatively less resistive to an acid and is readily lost or damaged.

However, as described above, the oxidative treatment is performed on the interlayer film 120 to allow the oxidation to proceed from the surface of the second film 124, by which the oxygen composition of the film is increased, the chemical stability is improved, and resistivity to an acid is remarkably enhanced. As a result, the loss of the interlayer film 120 and deterioration of the function thereof can be avoided, and the semiconductor device 300 with excellent electrical properties can be supplied.

2-9. Terminal and Source/Drain Electrode

Figure 12B:
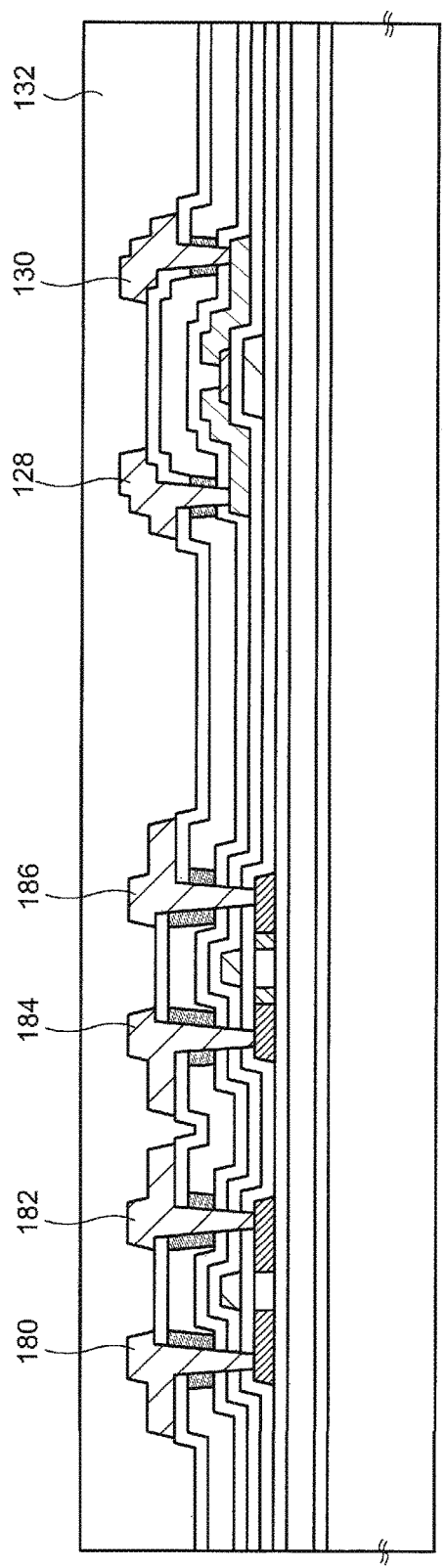

Next, the first terminal 128, the second terminal 130, the source/drain electrodes 180, 182, 184, and 186 are formed so as to fill the opening portions 118 and 190 and to be electrically connected to the source/drain electrodes 114 and 116 and the source/drain regions 164b, 164c, 166b, and 166c (FIG. 12B). These terminals and electrodes can be simultaneously formed by applying the material and the method described in the First Embodiment. Therefore, the first terminal 128, the second terminal 130, and the source/drain electrodes 180, 182, 184, and 186 can exist in the same layer.

2-10. Leveling Film

Similar to the First Embodiment, the leveling film 132 is formed as an optional structure (FIG. 12B). The formation method is as described in the First Embodiment.

Through these processes, the semiconductor device 300 can be fabricated.

The semiconductor device 300 of the present embodiment possesses, over the substrate 104, a plurality of transistors (first transistor 102, second transistor 160, and third transistor 162) which are different in material of the semiconductor films governing the electrical properties. The second film 124 which has a function to prevent entrance of impurities but has low chemical stability is included in the interlayer film 120 formed over the first transistor 102 containing the oxide semiconductor film 112. However, the oxidative treatment on the second film 124 is capable of improving chemical stability, while leaving the function to prevent entrance of impurities. As a result, the first transistor 102 with small variation and excellent electrical properties can be obtained.

The first transistor 102 including the oxide semiconductor 112 is characterized by a low off-current. On the other hand, the second transistor 160 and the third transistor 162 having the silicon semiconductor films 164 and 166 are characterized by high field-effect mobility. The application of the present embodiment enables production of a semiconductor device having these features.

Fourth Embodiment

Figure 13:
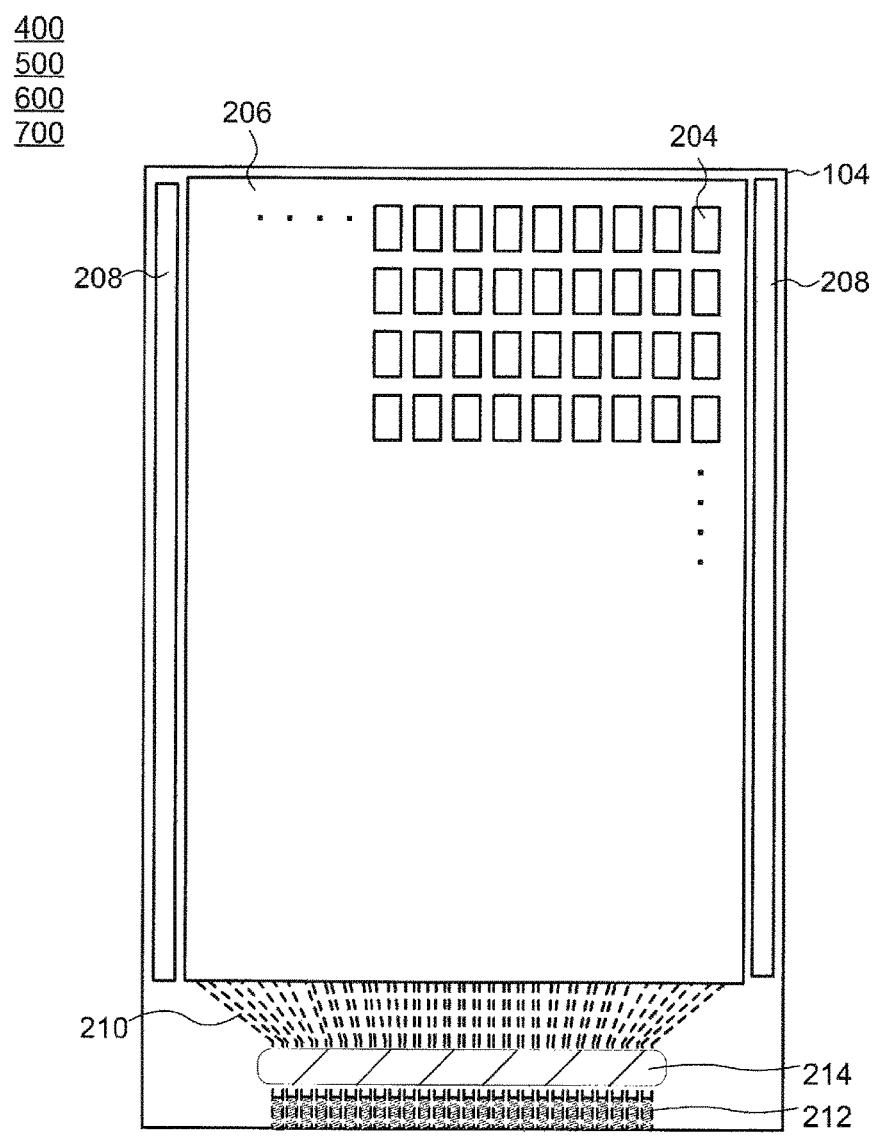
FIG. 13 is a schematic top view of display devices of embodiments of the present invention.
Figure 14:
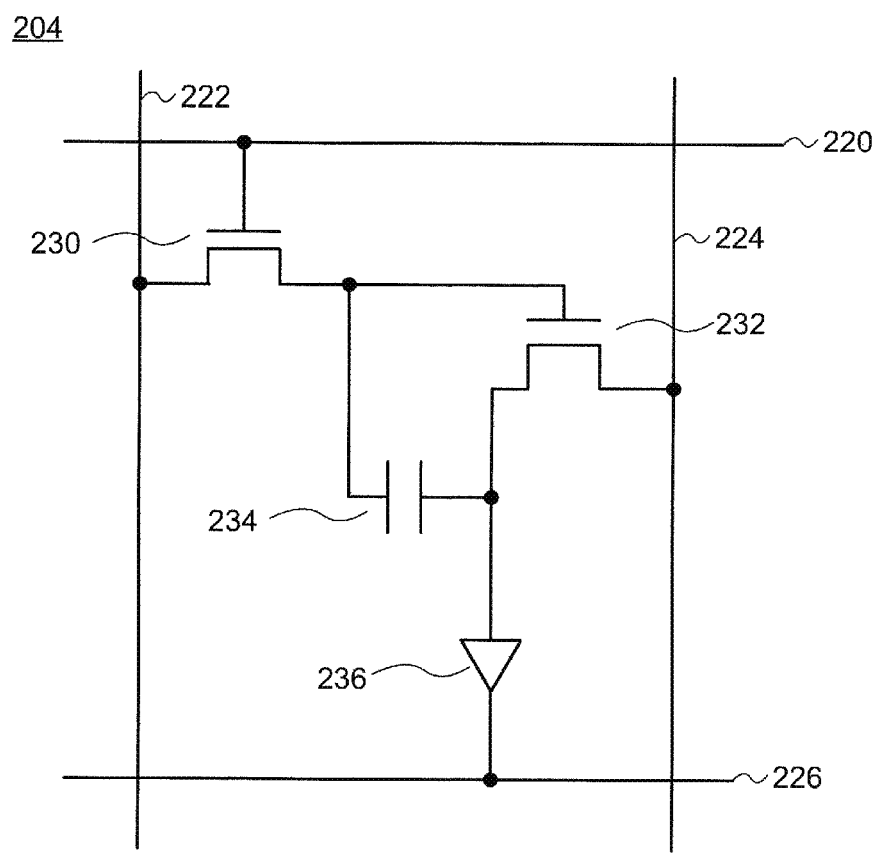
FIG. 14 is an equivalent circuit of a pixel of a display device of an embodiment of the present invention.
Figure 15:
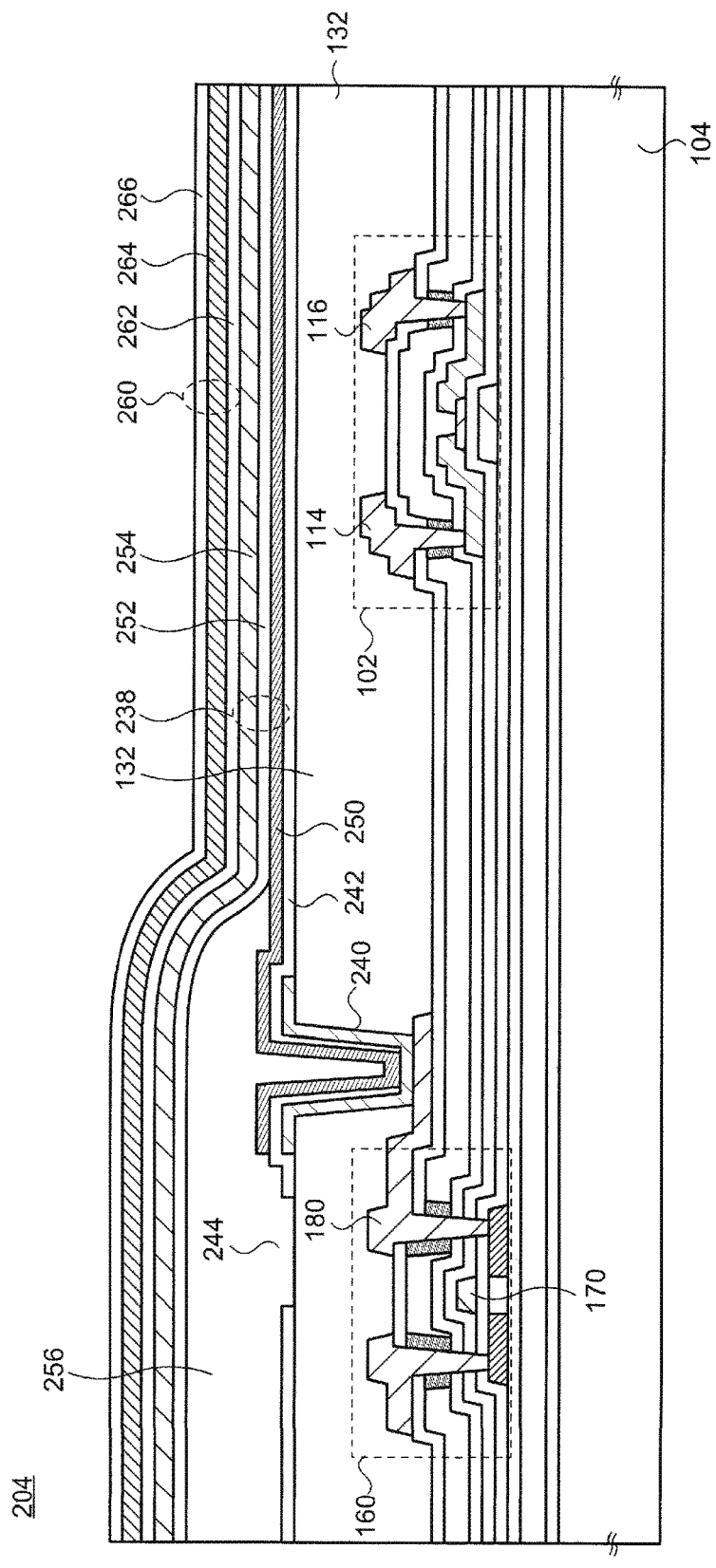
FIG. 15 is a schematic cross-sectional view of a display device of an embodiment of the present invention.

In the present embodiment, a display device including the semiconductor device 100, 200, or 300 described in the First to Third Embodiments and a manufacturing method thereof are explained by using FIG. 13 to FIG. 15.

Explanation of duplicated contents of the First to Third Embodiments may be omitted.

1. Outline Structure

A schematic top view of a display device 400 of the present embodiment is shown in FIG. 13. The display device 400 has a display region 206 provided with a plurality of pixels 204 and gate side driver circuits (hereinafter, referred to as driver circuits) 208 over one surface (top surface) of the substrate 104. Display elements such as a light-emitting element and a liquid crystal element giving colors different from one another can be disposed in the plurality of pixels 204, by which full-color display can be conducted. For example, display elements providing red, green, and blue colors may be arranged in three pixels 204, respectively. Alternatively, display elements exhibiting white color may be used in all pixels 204, and full-color display may be performed by using a color filter to extract red, green, or blue colors from the respective pixels 204. The colors finally extracted are not limited to a combination of red, green, and blue colors. For instance, four kinds of colors of red, green, blue, and white may be respectively extracted from four pixels 204. The arrangement of the pixels 204 is also not limited, and a stripe arrangement, a delta arrangement, a Pentile arrangement, and the like can be employed.

Wirings 210 extend from the display region 206 to a side surface of the substrate 104 (a short side of the display device 400 in FIG. 13), and the wirings 210 are exposed at an edge portion of the substrate 104 to form terminals 212. The terminals 212 are connected to a connector (not shown) such as a flexible printed circuit (FPC). The display region 206 is also electrically connected to an IC chip 214 via the wirings 210. With this structure, image signals supplied from an external circuit (not shown) are provided to the pixels 204 through the driver circuits 208 and the IC chip 214, and the display elements of the pixels 204 are controlled, allowing an image to be reproduced on the display region 206. Although not shown, the display device 400 may have a source side driver circuit at a periphery of the display region 206 instead of the IC chip 214. In the present embodiment, two driver circuits 208 are disposed so as to sandwich the display region 206. However, a single number of driver circuits 208 may be employed. Furthermore, the driver circuits 208 may not be arranged over the substrate 104, and a driver circuit 208 fabricated over another substrate may be mounted on the connector.

2. Pixel Circuit

An example of equivalent circuits of the pixels 204 is shown in FIG. 14. In FIG. 14, an example including a light-emitting element 238 such as an organic electroluminescence element as a display element 236 is illustrated. The pixel 204 possesses a gate line 220, a signal line 222, a current-supplying line 224, and a power source line 226.

The pixel 204 has a switching transistor 230, a driving transistor 232, a storage capacitor 234, and the display element 236. A gate, a source, and a drain of the switching transistor 230 are electrically connected to the gate line 220, the signal line 222, and a gate of the driving transistor 232, respectively. A source of the driving transistor 232 is electrically connected to the current-supplying line 224. One electrode of the storage capacitor 234 is electrically connected to the drain of the switching transistor 232 and the gate of the driving transistor 232, and the other electrode is electrically connected to a drain of the driving transistor 232 and one electrode (first electrode) of the display element 236. The other electrode (second electrode) of the display element 236 is electrically connected to the power source line 226. Note that the source and drain of each transistor may be interchanged depending on a direction of a current flow and polarity of the transistor.

In FIG. 14, a structure is illustrated in which the pixel 204 possesses two transistors (switching transistor 230 and driving transistor 232) and one storage capacitor (storage capacitor 234). However, the display device of the present embodiment is not limited to this structure, and the number of the transistors may be one, three, or more. The pixel 204 may not include a storage capacitor or possess a plurality of storage capacitors. Furthermore, the display element 236 is not limited to a light-emitting element and may be a liquid crystal element or an electrophoresis element. The wirings are not limited to the aforementioned gate line 220, signal line 222, current supplying line 224, and power source line 226. For example, the pixel 204 may have a plurality of gate lines or a wiring having another function. Alternatively, at least one of these wirings may be shared by the plurality of pixels 204.

3. Cross-Sectional Structure

A schematic cross-sectional view of the display device 400 is shown in FIG. 15. FIG. 15 schematically shows the structure of one pixel 204 in the display region 206. The display device 400 has a part of the semiconductor device 300 described in the Third Embodiment. Here, the first transistor 102 and the second transistor 160 of the semiconductor device 300 are included in the pixel 204. The former corresponds to the switching transistor 230, and the latter corresponds to the driving transistor 232 in FIG. 14. Thus, although not shown, one of the source/drain electrodes 114 and 116 of the first transistor 102 is connected to the second gate electrode 170 of the second transistor 160.

The display device 400 has the leveling film 132, and the leveling film 132 possesses an opening portion reaching the source/drain electrode 180 of the second transistor 160. The display device 400 further has a connection electrode 240 covering a side surface of the opening portion and electrically connected to the source/drain electrode 180. The connection electrode 240 may be formed with a conductive oxide having a light-transmitting property, such as indium-tin oxide (ITO) and indium-zinc oxide (IZO), by applying a sputtering method and the like, for example. The connection electrode 240 is not necessarily disposed. However, formation of the connection electrode 240 allows the source/drain electrodes 180 of the second transistor 160 to be protected by which an increase in contact resistance can be avoided.

The display device 400 further possesses an insulating film 242 covering a side surface of the connection electrode 240 and a top surface of the leveling film 132. The insulating film 242 can include an inorganic material containing silicon and can be formed by using a sputtering method, a CVD method, and the like. The connection electrode 240 is exposed from the insulating film 242 in the opening portion of the leveling film 132 in which the connection electrode 240 is connected to the first electrode 250 of the display element 238. Here, as shown in FIG. 15, the insulating film 242 has an opening portion 244 over the leveling film 132 in which a partition wall 256 formed later contacts with the leveling film 132. This opening portion 244 functions to transport impurities (water and gas such as oxygen) eliminated from the leveling film 132 to a side of the partition wall 256.

The display device 400 has the light-emitting element 238 over the leveling film 132. The first electrode 250 of the light-emitting element 238 is electrically connected to the source/drain electrode 180 through the connection electrode 240 in the opening portion provided in the leveling film 132.

When light emission from the light-emitting element 238 is extracted through the substrate 104, a material with a light-transmitting property exemplified by a conductive oxide such as ITO and IZO can be used for the first electrode 250. On the other hand, when the light emission from the light-emitting element 238 is extracted from an opposite side to the substrate 104, a metal such as aluminum and silver or an alloy thereof can be used. Alternatively, a stacked layer of the aforementioned metal or alloy with the conductive oxide, such as a stacked structure in which the metal is sandwiched by the conductive oxide (e.g., ITO/silver/ITO etc.) may be employed.

The partition wall 256 is arranged so as to cover an edge portion of the first electrode 250 and the opening portion provided in the leveling film 132 and has a function to absorb steps caused by these elements and electrically insulate the first electrodes 250 of the adjacent pixels 240 from each other. The partition wall 256 is also called a bank (rib). The partition wall 256 can be formed with a material usable in the leveling film 132, such as an epoxy resin and an acrylic resin. The partition wall 256 has an opening portion to expose a part of the first electrode 250, and an edge of the opening portion preferably has a moderately tapered shape. A steep inclination of the opening portion readily causes a coverage defect in an EL layer 250 and the second electrode 254 formed later.

The light-emitting element 238 has the EL layer 252, and the EL layer 252 is formed so as to cover the first electrode 250 and the partition wall 256. In the present specification and the claims, an EL layer means all of the layers sandwiched by a pair of electrodes and may be formed with a single layer or a plurality of layers. For example, the EL layer 252 may be formed by appropriately combining a carrier-injection layer, a carrier-transporting layer, an emission layer, a carrier-blocking layer, an exciton-blocking layer, and the like. Furthermore, the structure of the EL layer 252 may be different between the adjacent pixels 204. For example, the EL layer 252 may be configured so that the emission layer is different but other layers have the same structure between the adjacent pixels 204 and, by which different emission colors can be obtained from the adjacent pixels 204 to enable full-color display. On the contrary, the same EL layer 250 may be used in all pixels 204. In this case, the white-emissive EL layer 252 is formed so as to be shared by all pixels 204, and a wavelength of light extracted from each pixel 204 is selected by using a color filter and the like. The EL layer 250 can be formed by applying an evaporation method or the aforementioned wet-type film-formation method.

The light-emitting element 238 has the second electrode 254 over the EL layer 252. The light-emitting element 238 is configured by the first electrode 250, the EL layer 250, and the second electrode 254. Carriers (holes and electrons) are injected into the EL layer 252 from the first electrode 250 and the second electrode 254, and the light-emission is obtained through a relaxation process of an excited state generated by recombination of the carriers to a ground state. Hence, a region of the light-emitting element 238 in which the EL layer 252 and the first electrode 250 are in direct contact with each other is an emission region.

When the light-emission from the light-emitting element 238 is extracted through the substrate 104, a metal such as aluminum and silver or an alloy thereof can be used for the second electrode 254. On the other hand, when the light-emission from the light-emitting element 238 is extracted through the second electrode 254, the second electrode 254 is formed by using the aforementioned metal or alloy so as to have a thickness which allows visible light to pass therethrough. Alternatively, a material having a light-transmitting property exemplified by a conductive oxide such as ITO and IZO can be used for the second electrode 254. Moreover, a stacked structure of the aforementioned metal or alloy with the conductive oxide (e.g., Mg—Ag/ITO etc.) may be employed in the second electrode 254. The second electrode 254 can be formed with an evaporation method, a sputtering method, and the like.

A passivation film (sealing film) 260 is provided over the second electrode 254. A function of the passivation film 260 is to prevent moisture from entering the precedingly fabricated light-emitting element 238 from outside, and the passivation film 260 preferably has a high gas-barrier property. For example, it is preferred to form the passivation film 260 by using an inorganic material such as silicon nitride, silicon oxide, silicon nitride oxide, and silicon oxynitride. Alternatively, an organic resin including an acrylic resin, a polysiloxane, a polyimide, a polyester, and the like may be used. In the structure illustratively shown in FIG. 15, the passivation film 260 possesses a three-layer structure including a first layer 262, a second layer 264, and a third layer 266.

Specifically, the first layer 262 may include an inorganic insulator such as silicon oxide, silicon nitride, silicon oxynitride, and silicon nitride oxide and may be formed by applying a CVD method or a sputtering method. A polymer material can be employed for the second layer 264, for example, and can be selected from an epoxy resin, an acrylic resin, a polyimide, a polyester, a polycarbonate, a polysiloxane, and the like. The second layer 264 can be formed with the aforementioned wet-type film-formation method. The second layer 264 may also be formed by gasifying or atomizing oligomers serving as a raw material of the aforementioned polymer material and spraying the first layer 262 with the oligomers, followed by polymerizing the oligomers. In this case, a polymerization initiator may be mixed in the oligomers. Additionally, the first layer 262 may be sprayed with the oligomers while cooling the substrate 104. The third layer 266 can be formed by employing the material and the formation method which are the same as those of the first layer 262.

Although not shown, an opposing substrate may be disposed over the passivation film 260 as an optional structure. The opposing substrate is fixed with the substrate 104 by using an adhesive. In this case, a space between the opposing substrate and the passivation film may be filled with an inert gas or a filler such as a resin. Alternatively, the passivation film 260 and the opposing substrate may be adhered directly with an adhesive. When a filler is used, the filler preferably has a high light-transmitting property. When the opposing substrate is fixed to the substrate 104, a gap therebetween may be adjusted by including a spacer in an adhesive or a filler. Alternatively, a structural member serving as a spacer may be placed between the pixels 204.

The opposing substrate may be further provided with a light-shielding film having an opening in a region overlapping with the emission region or a color filter over a region overlapping with the emission region. The light-shielding film is formed by using a metal with a relatively low reflectance, such as chromium and molybdenum, or a resin material including a coloring material of black or a similar color and has a function to block scattered light, reflected ambient light, and the like other than the light directly obtained from the emission region. An optical property of the color filter may be changed between the adjacent pixels 204 and may be configured to extract red, green, and blue emissions, for example. The light-shielding film and the color filter may be provided to the opposing substrate with a base film interposed therebetween, and an overcoat layer may be further arranged so as to cover the light-shielding film and the color filter.

The display device 400 shown in the present embodiment has the second transistor 160 including a silicon semiconductor film as the driving transistor 232. A transistor including a silicon semiconductor, particularly, a transistor including a polycrystalline silicon semiconductor has a high filed-effect mobility, which allows a large current to be flowed therein. Therefore, it is possible to supply a large current to the light-emitting element 238.

On the other hand, the use of the first transistor 102 as the switching transistor 230 allows the image data transmitted from the signal line 222 to be stored at the second gate electrode 170 of the second transistor 160 serving as the driving transistor 232 or at the storage capacitor 234 for a long time because a transistor including an oxide semiconductor exhibits a low off-current. Hence, the storage capacitor 234 becomes unnecessary, or its size can be decreased. As a result, it is possible to decrease power consumption and increase an aperture ratio of the display device 400. Additionally, variation of a current flowing in the light-emitting element 238 can be reduced because a transistor including an oxide semiconductor has small variation in threshold voltage. Accordingly, the display device 400 capable of supplying a high-quality image can be produced.

Fifth Embodiment

Figure 16:
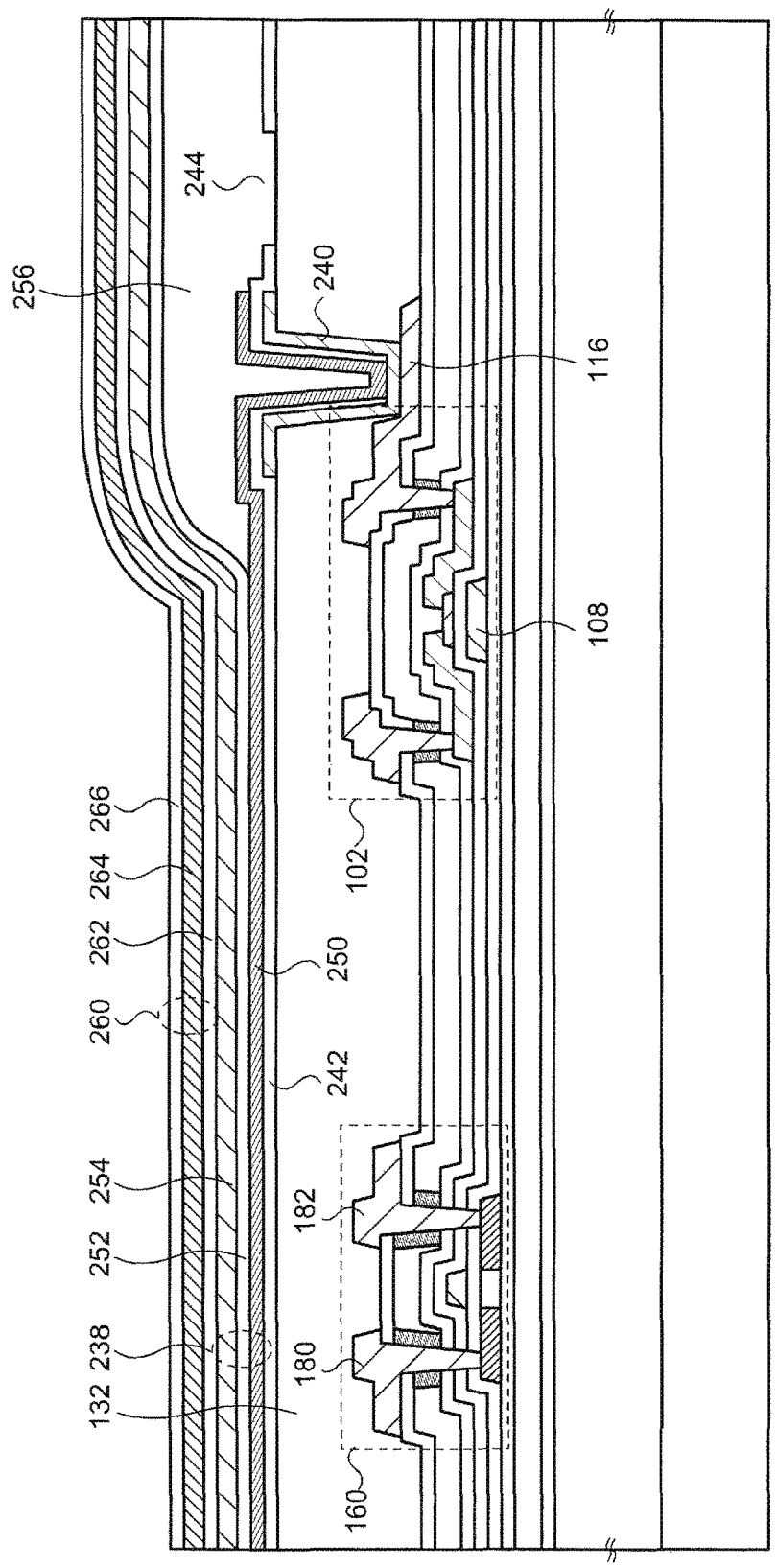
FIG. 16 is a schematic cross-sectional view of a display device of an embodiment of the present invention.

In the present embodiment, a display device including the semiconductor device 100, 200, or 300 described in the First to Third Embodiments and a manufacturing method thereof are explained by using FIG. 13, FIG. 14, and FIG. 16. Explanation of duplicated contents of the First to Fourth Embodiments may be omitted.

A schematic cross-sectional view of a display device 500 of the present embodiment is shown in FIG. 16. FIG. 16 corresponds to the cross-sectional view of the pixel 204 shown in FIG. 13. The display device 500 has a part of the semiconductor device 300 described in the Third Embodiment in the pixel 204, and the source/drain electrode 116 of the first transistor 102 is electrically connected to the light-emitting element 238. That is, the first transistor 102 functions as the driving transistor 232 in the pixel 204 shown in FIG. 14. Moreover, the second transistor 160 corresponds to the switching transistor 230. Although not shown in FIG. 16, one of the source/drain electrodes 180 and 182 of the second transistor 160 is electrically connected to the gate electrode 108 of the first transistor 102.

The display device 500 shown in the present embodiment has the second transistor 160 including a silicon semiconductor film as the switching transistor 230. Since a transistor including a silicon semiconductor film, particularly, a transistor including a polycrystalline silicon transistor has a high filed-effect mobility, a high-speed switching characteristic is attainable in the pixel 204.

On the other hand, the pixel 204 has the first transistor 102 including the oxide semiconductor film 112 as the driving transistor 232. Since a transistor including an oxide semiconductor film has small variation in threshold voltage, it is possible to reduce variation in current flowing in the light-emitting element 238. As a result, the display device 500 capable of supplying a high-quality image can be produced.

Sixth Embodiment

Figure 17:
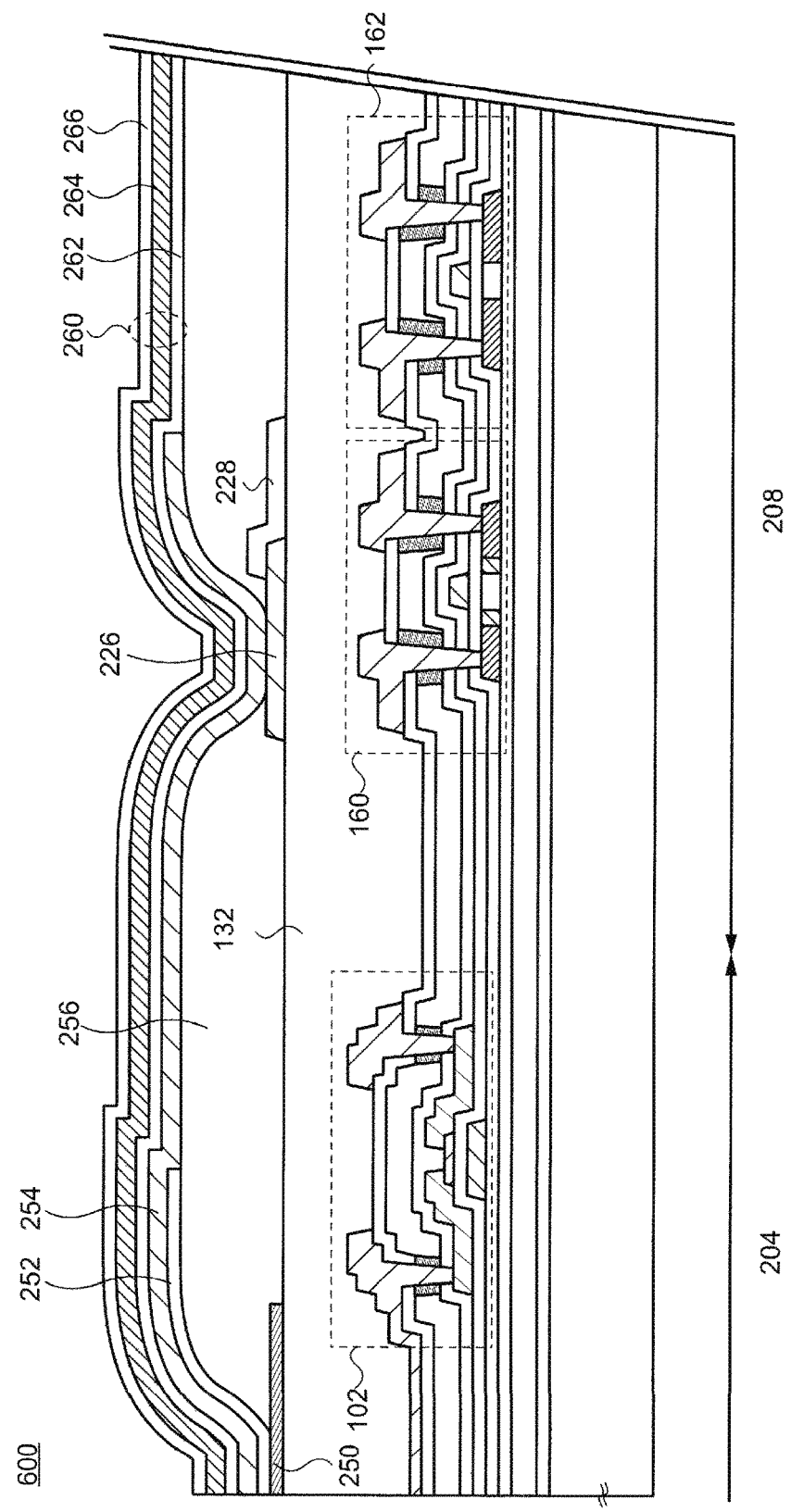
FIG. 17 is a schematic cross-sectional view of a display device of an embodiment of the present invention.

In the present embodiment, a display device including the semiconductor device 100, 200, or 300 described in the First to Third Embodiments and a manufacturing method thereof are explained by using FIG. 13, FIG. 14, and FIG. 17. Explanation of duplicated contents of the First to Fifth Embodiments may be omitted.

A schematic cross-sectional view of a display device 600 of the present embodiment is shown in FIG. 17. FIG. 17 schematically shows one pixel 204 located in the display region 206 and closest to the driver circuit 208, a part of the driver circuit 208, and a peripheral structure thereof. The display device 600 has the semiconductor device 300 described in the Third Embodiment. Here, the first transistor 102 of the semiconductor device 300 is included in the pixel 204 and functions as the switching transistor 230 shown in FIG. 14. On the other hand, the second transistor 160 and the third transistor 162 are included in the driver circuit 208.

In a region including the driver circuit 208, the power source line 226 is provided over the leveling film 132. The power source line 226 can contain a conductive oxide having a light-transmitting property, such as ITO and IZO, a metal such as aluminum, or an alloy thereof and can be formed simultaneously with the first electrode 252 of the light-emitting element 238 or the connection electrode 240 described in the Fourth Embodiment. An edge portion of the power source line 226 is covered by the partition wall 256, and a portion exposed from the partition wall 256 is connected to the second electrode 254 extending from the light-emitting element 238. This structure allows the second electrode 254 to be supplied with a constant voltage applied to the power source line 226.

An auxiliary electrode 228 is formed so as to be in contact with the power source line 226. The auxiliary electrode 228 is covered by the partition wall 256. The auxiliary electrode 228 can include a metal such as aluminum and molybdenum or an alloy thereof and has a function to compensate the low conductivity of the power source 226. When the resistance of the second electrode 254 is relatively high, the formation of the auxiliary electrode 228 prevents a voltage drop caused by the second electrode 254. Therefore, the auxiliary electrode 228 may not be provided when the power source line 226 has a sufficient conductivity.

The display device 600 shown in the present embodiment possesses the second transistor 160 and the third transistor 162 each including a silicon semiconductor film in the driver circuit 208. Since a transistor including a silicon semiconductor film, particularly, a transistor including a polycrystalline silicon transistor has a high filed-effect mobility, a high-speed operation is feasible in the driving circuit 208 including these transistors. On the other hand, the pixel 204 has the first transistor 102 including the oxide semiconductor film 112. Since a transistor including an oxide semiconductor film has a low off-current, the image data transmitted from the signal line 222 can be stored at the gate of the driving transistor 232 or at the storage capacitor 234 for a long time. Hence, the storage capacitor 234 becomes unnecessary, or its size can be decreased. As a result, it is possible to decrease power consumption and increase an aperture ratio of the display device 600. Additionally, variation of a current flowing in the light-emitting element 238 can be reduced because a transistor including an oxide semiconductor has small variation in threshold voltage. Accordingly, the display device 600 capable of supplying a high-quality image can be produced.

Seventh Embodiment

Figure 18:
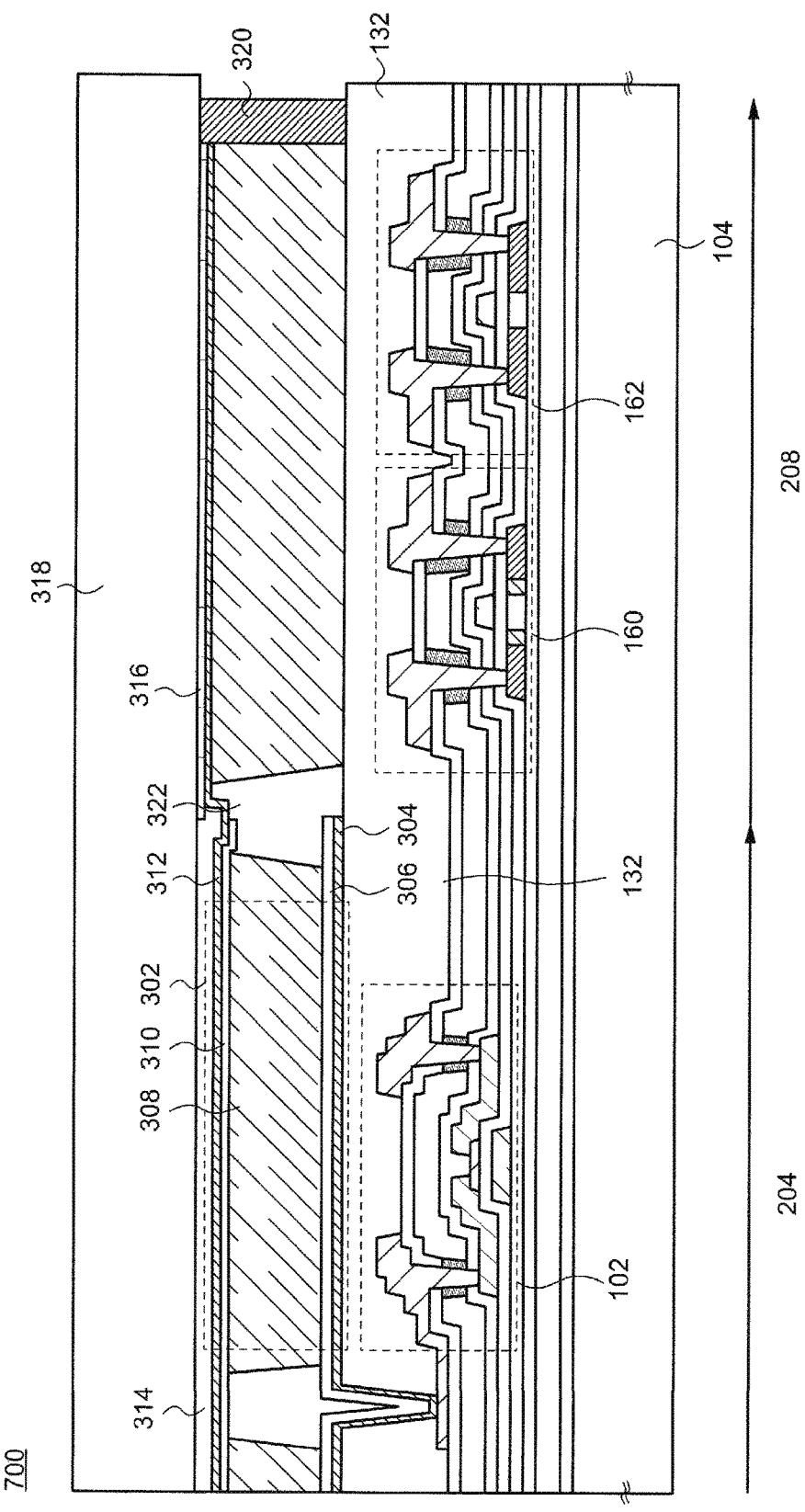
FIG. 18 is a schematic cross-sectional view of a display device of an embodiment of the present invention.

In the present embodiment, a display device including the semiconductor device 100, 200, or 300 described in the First to Third Embodiments and a manufacturing method thereof are explained by using FIG. 13 and FIG. 18. Explanation of duplicated contents of the First to Sixth Embodiments may be omitted.

A schematic cross-sectional view of a display device 700 of the present embodiment is shown in FIG. 18. FIG. 18 schematically shows the pixel 204 in the display region 206 shown in FIG. 13 and a part of the driver circuit 208. The display device 700 has the semiconductor device 300 described in the Third Embodiment. The first transistor 102 including the oxide semiconductor film 112 is disposed in the pixel 204, while the second transistor 160 and the third transistor 162 respectively including the silicon semiconductor films 164 and 166 are provided in the driver circuit 208.

Unlike the display devices 400, 500, and 600, the display device 700 possesses a liquid crystal element 302 as a display element in the pixel 204. The liquid crystal element 302 has a first electrode 304 over the leveling film 132, a first orientation film 306 over the first electrode 304, a liquid crystal layer 308 over the first orientation film 306, a second orientation film 310 over the liquid crystal layer 308, and a second electrode 312 over the second orientation film 310. A color filter 314 is provided over the liquid crystal element 302 as an optional structure. A light-shielding film 316 is formed in a region overlapping with the driver circuit 208.

An opposing substrate 318 is disposed over the liquid crystal element 302 and is fixed to the substrate 104 with a sealing material 320. The liquid crystal layer 308 is sandwiched between the substrate 104 and the opposing substrate 318, and a thickness of the liquid crystal layer 308, that is, a distance between the substrate 104 and the opposing substrate 318 is maintained with a spacer 322. Although not shown, a polarization plate, a retardation film, or the like may be arranged under the substrate 104 or over the opposing substrate 318.

In the present embodiment, the display device 700 is explained so as to have the so-called VA (Vertical Alignment) mode or TN (Twisted Nematic) mode. However, the liquid crystal element 302 is not limited to these modes and may have another mode such as IPS (In-Plan-Switching) mode. When a transmissive liquid crystal element is utilized, the liquid crystal element 302 is arranged so as not to overlap with the first transistor 102.

The display device 700 shown in the present embodiment possesses the second transistor 160 and the third transistor 162 each including a silicon semiconductor film in the driver circuit 208. Since a transistor including a silicon semiconductor film, particularly, a transistor including a polycrystalline silicon transistor has a high filed-effect mobility, a high-speed operation is feasible in the driving circuit 208 including these transistors. On the other hand, the pixel 204 has the first transistor 102 including the oxide semiconductor film 112. Since a transistor including an oxide semiconductor has small variation in threshold voltage, variation of a voltage applied to the liquid crystal element 302 can be reduced. Accordingly, variation of transmittance of the liquid crystal element 302 is decreased, and the display device 700 capable of supplying a high-quality image can be produced.

The aforementioned modes described as the embodiments of the present invention can be implemented by appropriately combining with each other as long as no contradiction is caused. Furthermore, any mode which is realized by persons ordinarily skilled in the art through the appropriate addition, deletion, or design change of elements or through the addition, deletion, or condition change of a process is included in the scope of the present invention as long as they possess the concept of the present invention.

In the specification, although the cases of the organic EL display device are exemplified, the embodiments can be applied to any kind of display devices of the flat panel type such as other self-emission type display devices, liquid crystal display devices, and electronic paper type display device having electrophoretic elements and the like. In addition, it is apparent that the size of the display device is not limited, and the embodiment can be applied to display devices having any size from medium to large.

It is properly understood that another effect different from that provided by the modes of the aforementioned embodiments is achieved by the present invention if the effect is obvious from the description in the specification or readily conceived by persons ordinarily skilled in the art.

What is claimed is:

1. A semiconductor device comprising:
    a substrate having an insulating surface;
    a first transistor on the insulating surface, the first transistor having an oxide semiconductor film;
    an insulating film over the first transistor; and
    a terminal electrically connected to the oxide semiconductor film through an opening portion in the insulating film, wherein
    the insulating film has a first region in contact with the terminal, and
    an oxygen composition of the first region is larger than that of another region of the insulating film.

2. The semiconductor device according to claim 1, wherein
    the insulating film comprises a first film and a second film over the first film, and
    the first region is located in the second film.

3. The semiconductor device according to claim 1, wherein
    the oxygen composition of the first region decreases with increasing distance from an interface with the terminal.

4. The semiconductor device according to claim 3, wherein
    the distance is in a direction parallel to the insulating surface of the substrate.

5. The semiconductor device according to claim 2, wherein
    the first film includes silicon and oxygen, and
    the second film includes silicon and nitrogen.

6. The semiconductor device according to claim 2, wherein
    the insulating film further comprises a third film over the second film.

7. The semiconductor device according to claim 1, further comprises a second transistor having a semiconductor film, wherein
    the insulating film extends over the second transistor, and
    a gate electrode of the first transistor and a gate electrode of the second transistor are located in the same layer.

8. A display device comprising:
    a substrate having an insulating surface;
    a first transistor on the insulating surface, the first transistor having an oxide semiconductor film;
    an insulating film over the first transistor;
    a first terminal electrically connected to the oxide semiconductor film through a first opening portion in the insulating film;
    a leveling layer over the first terminal; and
    a display element over the leveling layer, wherein
    the insulating film has a first region in contact with the first terminal, and
    an oxygen composition of the first region is larger than that of another region of the insulating film.

9. The display device according to claim 8, wherein
    the insulating film comprises a first film and a second film over the first film, and
    the first region is located in the second film.

10. The display device according to claim 8, wherein
    the oxygen composition of the first region decreases with increasing distance from an interface with the first terminal.

11. The display device according to claim 10, wherein
    the distance is in a direction parallel to the insulating surface of the substrate.

12. The display device according to claim 9, wherein
    the first film includes silicon and oxygen, and
    the second film includes silicon and nitrogen.

13. The display device according to claim 9, wherein
    the insulating film further comprises a third film over the second film.

14. The display device according to claim 8, further comprises a second transistor having a semiconductor film, wherein
    the insulating film extends over the second transistor,
    a second terminal is electrically connected to the semiconductor film through a second opening portion in the insulating film, and
    a gate electrode of the first transistor and a gate electrode of the second transistor are located in the same layer.

15. The display device according to claim 8, wherein
the display element has two electrodes, and
one of the two electrodes of the display element is electrically connected to the first terminal through a third opening portion in the leveling layer.

16. The display device according to claim 14, wherein
the display element has two electrodes, and
one of the two electrodes of the display element is electrically connected to the second terminal through a fourth opening portion in the leveling layer.

* * * * *